(12) United States Patent
Lee et al.

(10) Patent No.: US 12,414,373 B2
(45) Date of Patent: Sep. 9, 2025

(54) DISPLAY DEVICE

(71) Applicant: Samsung Display Co., Ltd., Yongin-si (KR)

(72) Inventors: Seung Chan Lee, Hwaseong-si (KR); Hong Am Kim, Seoul (KR); Jin-Whan Jung, Yesan-gun (KR); Young Min Cho, Seongnam-si (KR); Ju Yeon Kim, Anyang-si (KR); Beom Soo Park, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 55 days.

(21) Appl. No.: 17/519,420

(22) Filed: Nov. 4, 2021

(65) Prior Publication Data

US 2022/0149080 A1 May 12, 2022

(30) Foreign Application Priority Data

Nov. 6, 2020 (KR) .................. 10-2020-0148020

(51) Int. Cl.
*H10D 86/60* (2025.01)
*H10D 30/67* (2025.01)
*H10D 86/40* (2025.01)

(52) U.S. Cl.
CPC ........ *H10D 86/60* (2025.01); *H10D 30/6731* (2025.01); *H10D 30/6745* (2025.01); *H10D 30/6755* (2025.01); *H10D 86/423* (2025.01); *H10D 86/441* (2025.01); *H10D 86/471* (2025.01)

(58) Field of Classification Search
CPC ............... H01L 27/124; H01L 27/1225; H01L 27/1251; H01L 29/78675; H01L 29/7869
USPC .......................................................... 257/43
See application file for complete search history.

(56) References Cited

U.S. PATENT DOCUMENTS

| 7,515,406 B2 | 4/2009 | Kee et al. |
| 7,612,397 B2 * | 11/2009 | Ueda .............. H10B 69/00 |
| | | 257/532 |
| 7,902,602 B2 | 3/2011 | Koo et al. |

(Continued)

FOREIGN PATENT DOCUMENTS

| KR | 10-2005-0123332 | 12/2005 |
| KR | 10-2008-0093340 | 10/2008 |

(Continued)

OTHER PUBLICATIONS

Office Action dated Aug. 5, 2025, issued by Korean Patent Office in Korean Patent Application No. 10-2020-0148020.

*Primary Examiner* — Ori Nadav
(74) *Attorney, Agent, or Firm* — Sughrue Mion, PLLC

(57) ABSTRACT

A display device includes a display area and a non-display area; and a pad portion disposed in the non-display area, wherein the pad portion includes a first conductive layer; a second conductive layer that partially overlaps the first conductive layer in a direction perpendicular to a surface of the substrate; a first insulation film disposed between the first conductive layer and the second conductive layer; a second insulation film that is disposed on the first conductive layer and the second conductive layer and includes an opening overlapping the first conductive layer and the second conductive layer; and a third conductive layer disposed on the second insulation film.

6 Claims, 30 Drawing Sheets

(56) References Cited

U.S. PATENT DOCUMENTS

| | | | | |
|---|---|---|---|---|
| 8,198,666 | B2* | 6/2012 | Asami | H10B 41/49 |
| | | | | 257/314 |
| 9,397,153 | B2* | 7/2016 | Tanaka | H01L 29/7869 |
| 10,282,016 | B2 | 5/2019 | Yoon et al. | |
| 10,403,689 | B2 | 9/2019 | Park et al. | |
| 10,468,396 | B2* | 11/2019 | Kim | G09G 3/3426 |
| 2007/0064187 | A1* | 3/2007 | Takeda | G02F 1/1393 |
| | | | | 349/127 |
| 2011/0084257 | A1* | 4/2011 | Kwon | H10K 50/818 |
| | | | | 257/89 |
| 2015/0091006 | A1* | 4/2015 | Cho | G02F 1/136286 |
| | | | | 257/43 |
| 2015/0263006 | A1* | 9/2015 | Kato | H01L 29/78651 |
| | | | | 257/43 |
| 2018/0204856 | A1* | 7/2018 | Noh | G02F 1/136286 |
| 2019/0140029 | A1 | 5/2019 | Kim et al. | |
| 2020/0295047 | A1* | 9/2020 | Shin | H01L 27/1255 |
| 2020/0302877 | A1 | 9/2020 | Moon et al. | |

FOREIGN PATENT DOCUMENTS

| | | |
|---|---|---|
| KR | 10-2017-0038301 | 4/2017 |
| KR | 10-2017-0064155 | 6/2017 |
| KR | 10-2019-0041564 | 4/2019 |
| KR | 10-2019-0063793 | 6/2019 |
| KR | 10-2020-0113079 A | 10/2020 |

* cited by examiner

DISPLAY DEVICE

CROSS-REFERENCE TO RELATED APPLICATION

This application claims priority from and the benefit of Korean Patent Application No. 10-2020-0148020, filed on Nov. 6, 2020, which is hereby incorporated by reference for all purposes as if fully set forth herein.

BACKGROUND

Field

Embodiments of the invention relate generally to a display device and, more specifically, to a display device in which a step of a pad portion of the display device may be reduced.

Discussion of the Background

Display devices, such as an organic light emitting display device and a liquid crystal display device, are used. The display device includes a display panel including a pixel that displays an image. In addition to the pixel, a circuit and a pad for inputting a signal used to control the pixel and the circuit are formed on the display panel, and a signal line connected to the pad to transmit a signal is formed thereon.

The pad may be formed in the same process as the pixel, and may have a stacked structure similar to that of the pixel.

The above information disclosed in this Background section is only for enhancement of understanding of the background of the invention, and therefore it may contain information that does not form the prior art that is already known in this country to a person of ordinary skill in the art.

SUMMARY

Embodiments are to provide a display device in which a connection failure may be prevented by reducing a step of a pad portion.

Additional features of the inventive concepts will be set forth in the description which follows, and in part will be apparent from the description, or may be learned by practice of the inventive concepts.

An embodiment of the present invention provides a display device including a substrate including a display area and a non-display area; and a pad portion disposed in the non-display area, wherein the pad portion includes a first conductive layer; a second conductive layer that partially overlaps the first conductive layer in a direction perpendicular to a surface of the substrate; a first insulation film disposed between the first conductive layer and the second conductive layer; a second insulation film that is disposed on the first conductive layer and the second conductive layer and includes an opening overlapping the first conductive layer and the second conductive layer; and a third conductive layer disposed on the second insulation film, wherein the third conductive layer contacts the first conductive layer and the second conductive layer in the opening of the second insulation film, respectively, and wherein the third conductive layer includes a first contact area in direct contact with the first conductive layer and a second contact area in direct contact with the second conductive layer.

A plurality of the first contact areas may be disposed to be spaced apart from each other in sub-openings within the opening of the second insulation film.

The first contact area may be disposed closer to the substrate than the second contact area.

A sum of areas of the first contact areas may be 1.5 μm2 or more.

A shortest width of the first contact area may be 20 μm or less.

A planar area occupied by the second contact area among the opening of the second insulation film may be 30% or more.

The first insulation film may not be disposed between the first conductive layer and the third conductive layer in the first contact area, and the first conductive layer and the second conductive layer may not overlap the surface of the substrate in a vertical direction.

A length of the first conductive layer in a first direction parallel to the surface of the substrate may be longer than a length of the second conductive layer in the first direction parallel to the surface of the substrate.

The second conductive layer may include at least one sub-opening overlapping the first conductive layer, and wherein the first conductive layer and the third conductive layer may be in direct contact in the at least one sub-opening.

The at least one sub-openings of the second conductive layer may be disposed within the opening of the second insulation film, and wherein a shape of the at least one sub-openings of the second conductive layer may be one of a linear shape, a circular shape, and a polygonal shape.

The pad portion may further include a second data layer disposed on the third conductive layer.

The display area may include a polycrystalline semiconductor layer disposed on the substrate; a first gate conductive layer disposed on the polycrystalline semiconductor layer and disposed on the same layer as the first conductive layer of the pad portion; a second gate insulation film on the first gate conductive layer; a second gate conductive layer disposed on the second gate insulation film; a first interlayer insulation film disposed on the second gate conductive layer; an oxide semiconductor layer disposed on the first interlayer insulation film; a third gate insulation film disposed on the oxide semiconductor layer; and a third gate conductive layer disposed on the third gate insulation film and positioned on the same layer as the second conductive layer of the pad portion, and a portion of the first gate conductive layer may function as a gate electrode of the polycrystalline semiconductor layer, while a portion of the third gate conductive layer may function as a gate electrode of the oxide semiconductor layer.

The display area may further include a second interlayer insulation film disposed on the third gate conductive layer; and a first data conductive layer disposed on the second interlayer insulation film and disposed on the same layer as the third conductive layer of the pad portion, and wherein the first insulation film of the pad portion may include the second gate insulation film and the first interlayer insulation film of the display area, while the second insulation film of the pad portion may include a second interlayer insulation film of the display area.

Another embodiment provides a display device including a substrate including a display area and a non-display area; and a pad portion disposed in the non-display area, wherein the pad portion includes a first conductive layer; a second conductive layer that partially overlaps the first conductive layer in a direction perpendicular to a surface of the substrate; a first insulation film disposed between the first conductive layer and the second conductive layer; a second insulation film that is disposed on the first conductive layer and the second conductive layer and includes an opening overlapping the first conductive layer and the second conductive layer; and a third conductive layer disposed on the second insulation film, wherein the third conductive layer contacts the first conductive layer and the second conductive layer in the opening of the second insulation film, respectively, and a length of the first conductive layer in a first direction parallel to the surface of the substrate is longer than a length of the second conductive layer in the first direction parallel to the surface of the substrate, or the second conductive layer includes at least one sub-opening overlapping the first conductive layer.

The third conductive layer may be in direct contact with the second conductive layer in an area in which the first conductive layer and the second conductive layer overlap in a direction perpendicular to a surface of the substrate, and the third conductive layer may be in direct contact with the first conductive layer in an area in which the first conductive layer and the second conductive layer do not overlap in the direction perpendicular to the surface of the substrate.

An area of a region in which the first conductive layer and the second conductive layer overlap in the direction perpendicular to the surface of the substrate may be 30% or more among an entire area of the opening of the second insulation film.

An area sum of regions in which the first conductive layer and the second conductive layer do not overlap in the direction perpendicular to the surface of the substrate among the opening of the second insulation film may be 1.5 µm2 or more.

The at least one sub-opening of the second conductive layer that overlap the first conductive layer may be disposed within the opening of the second insulation film, and a shape of the at least one sub-opening of the second conductive layer may be one of a linear shape, a circular shape, and a polygonal shape.

A shortest width of the at least one sub-opening of the second conductive layer may be 2 µm or less.

The pad portion may further include a second data layer disposed on the third conductive.

According to the embodiment, it is possible to provide a display device in which a connection failure is prevented by reducing a step of a pad portion.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
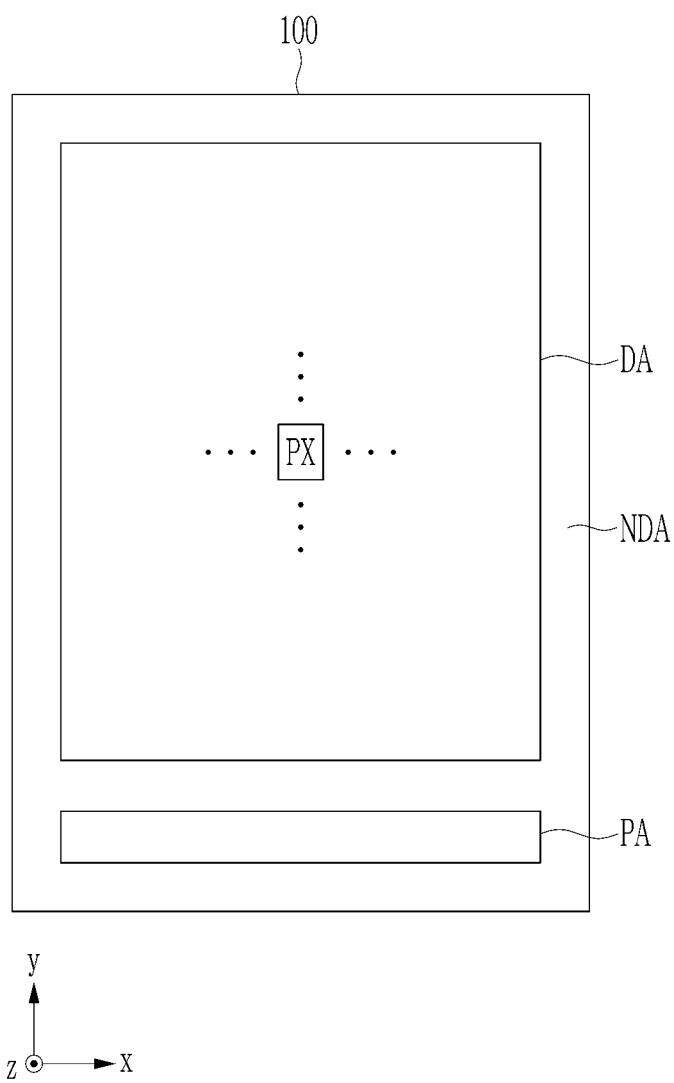
FIG. 1 illustrates a schematic layout view of a display panel according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 illustrates a schematic layout view of a display panel according to an embodiment.

Referring to FIG. 1, a display device according to an embodiment includes a display panel 100. The display panel 100 includes a display area DA, and a non-display area NDA around the display area DA in which circuits and/or signal lines configured to generate and/or transmit various signals applied to the display area DA are arranged.

Pixels PX are disposed in, for example, a matrix form in the display area DA of the display panel 100. Signal lines (not illustrated) such as scan lines, light emission control lines, data lines, and driving voltage lines are also arranged in the display area DA. Each pixel PX is connected to a scan line, a light emission control line, a data line, and a driving voltage line, and each pixel PX may receive a scan signal (also referred to as a gate signal), a light emission control signal, a data signal, a data voltage, and a driving voltage ELVDD from these signal lines.

A pad portion PA in which pads configured to receive signals from the outside of the display panel 100 are formed is disposed in the non-display area NDA of the display panel 100. Electronic components such as a flexible printed circuit film (not illustrated) may be bonded to the pad portion PA.

The pad portion PA may have a stacked structure similar to that of the display area DA. The specific stacked structure will be described in detail later.

Figure 2:
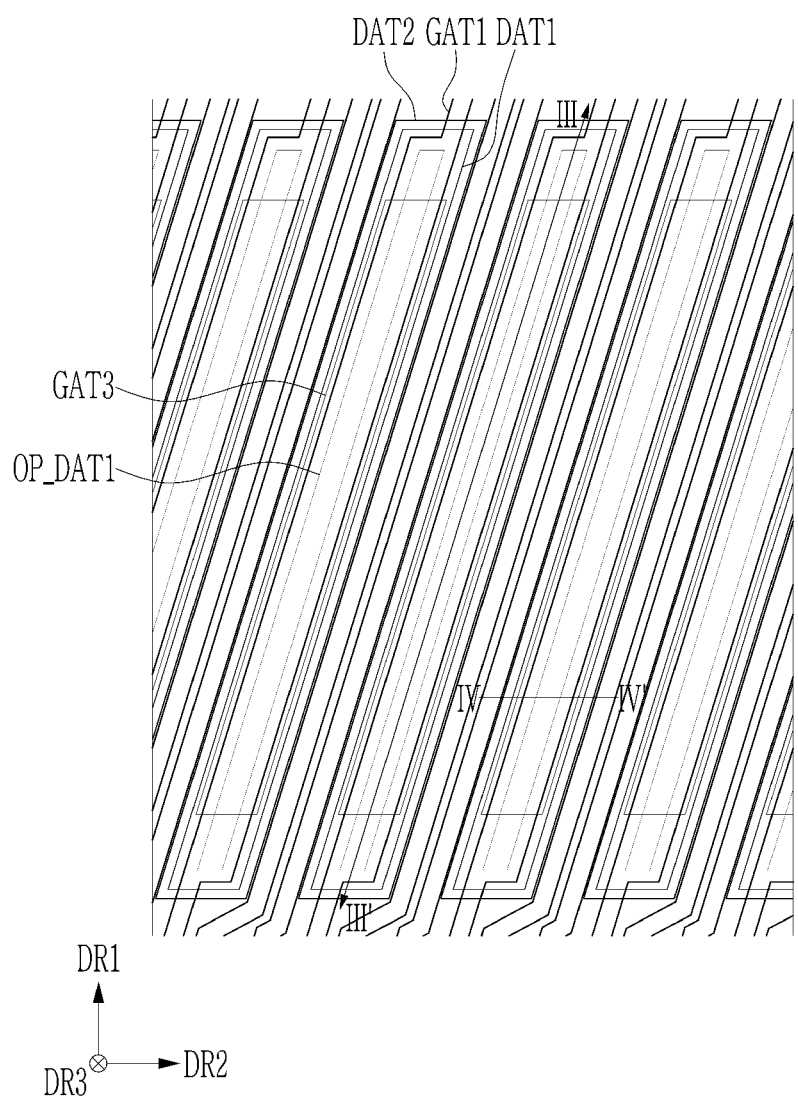
FIG. 2 illustrates a layout view of a portion of the pad portion of FIG. 1.
Figure 3:
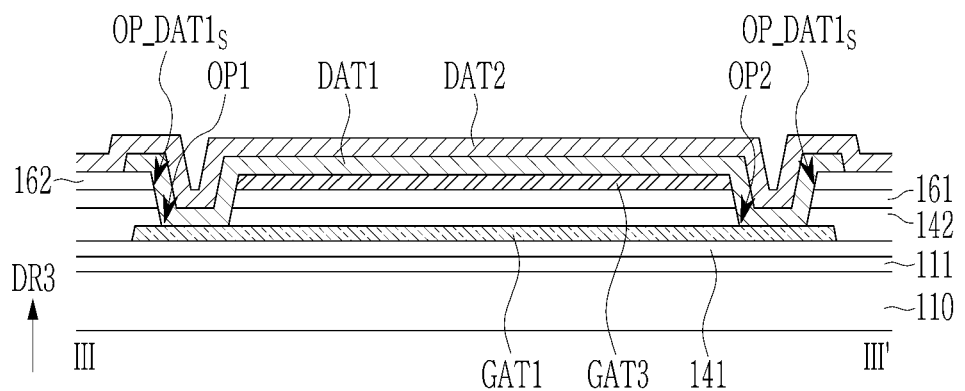
FIG. 3 illustrates a cross-sectional view taken along line III-III' of FIG. 2.

FIG. 2 illustrates a layout view of a portion of the pad portion PA of FIG. 1. FIG. 3 illustrates a cross-sectional view taken along line III-III' of FIG. 2, and FIG. 4 illustrates film including cross-sectional view taken along line IV-IV' of FIG. 2.

Figure 4:
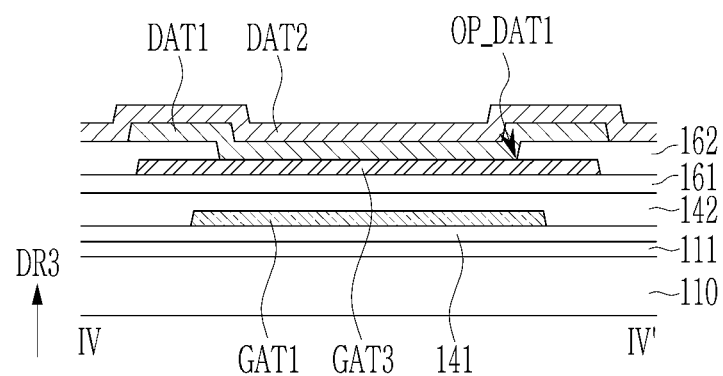
FIG. 4 illustrates film including cross-sectional view taken along line IV-IV' of FIG. 2.

Referring to FIG. 2 to FIG. 4, a barrier layer 111 is disposed on a substrate 110. The barrier layer 111 may include a silicon oxide (SiOx), a silicon nitride (SiNx), a silicon oxynitride (SiOxNy), or amorphous silicon (a-Si).

A first gate insulation film 141 may be disposed on the barrier layer 111. The first gate insulation film 141 may include a silicon oxide (SiOx), a silicon nitride (SiNx), or a silicon oxynitride (SiOxNy), and may have a single-layered or multi-layered structure including the same.

A first gate layer GAT1 may be disposed on the first gate insulation film 141. Although it will be described later, the first gate layer GAT1 may be disposed on the same layer as a first gate conductive layer in the display area DA. The first gate layer GAT1 may include molybdenum (Mo), aluminum (Al), copper (Cu), and/or titanium (Ti), and may have a single-layered or multi-layered structure including them.

Referring to FIG. 2, the first gate layer GAT1 may have a structure that is disposed long in one direction (hereinafter, length direction) slightly inclined from the first direction DR1 and of which width is extended in a second direction DR2 (hereinafter, width direction) in some areas. In an area in which the width of the first gate layer GAT1 is extended, a first data layer DAT1 and the like may contact the first gate layer GAT1, and a specific contact type therebetween will be described later.

Next, a second gate insulation film 142 and a first interlayer insulation film 161 are disposed on the first gate layer GAT1. The second gate insulation film 142 and the first interlayer insulation film 161 may each include a silicon oxide (SiOx), a silicon nitride (SiNx), or a silicon oxynitride (SiOxNy), and may have a single-layered or multi-layered structure including them.

Referring to FIG. 3, the second gate insulation film 142 and the first interlayer insulation film 161 include a first opening OP1 and a second opening OP2 overlapping the first gate layer GAT1 in a third direction DR3 perpendicular to a surface of the substrate 110.

In FIG. 2 to FIG. 4, the structure in which the pad portion PA includes the first gate layer GAT1 has been described, but the pad portion PA may include a second gate layer instead of the first gate layer GAT1. In this case, the second gate layer may be disposed on the same layer as a second gate conductive layer in the display area DA.

Referring back to FIG. 2 to FIG. 4, a third gate layer GAT3 is disposed on the first interlayer insulation film 161. The third gate layer GAT3 may be disposed on the same layer as a third gate conductive layer in the display area DA, and may include molybdenum (Mo), aluminum (Al), copper (Cu), and/or titanium (Ti), and may have a single-layered or multi-layered structure including them. For example, it may include a lower layer including titanium and an upper layer including molybdenum.

Referring to FIG. 2, the third gate layer GAT3 may partially overlap the first gate layer GAT1 in the third direction DR3. That is, a length in the length direction of the third gate layer GAT3 may be shorter than that in the length direction of the first gate layer GAT1. In addition, a width in the width direction of the third gate layer GAT3 may be wider than that in the width direction of the first gate layer GAT1. However, this is an example, and the width in the width direction of the third gate layer GAT3 may be narrower than that in the width direction of the first gate layer GAT1.

Referring to FIG. 3, because the length in the length direction of the third gate layer GAT3 is shorter than that of the first gate layer GAT1, in the cross-sectional view in the length direction as illustrated in FIG. 3, a portion of the first gate layer GAT1 does not overlap the third gate layer GAT3 in the third direction DR3. An area of the first gate layer GAT1 that does not overlap the third gate layer GAT3 may then directly contact the first data layer DAT1.

Referring to FIG. 2 to FIG. 4, a second interlayer insulation film 162 is disposed on the third gate layer GAT3. The second interlayer insulation film 162 may include a silicon oxide (SiOx), a silicon nitride (SiNx), or a silicon oxynitride (SiOxNy), and may a single-layered or multi-layered structure including the same.

Referring to FIG. 2 to FIG. 4, the second interlayer insulation film 162 includes a data opening OP_DAT1 overlapping the first gate layer GAT1 and the third gate layer GAT3 in the third direction DR3. As illustrated in FIG. 2 to FIG. 4, the first data layer DAT1 contacts the first gate layer GAT1 and the third gate layer GAT3 in the data opening OP_DAT1. The third gate layer GAT3 may cross over the data opening OP_DAT1 in the second direction DR2, and extend a shorter distance than the data opening OP_DAT1 in the first direction DR1.

That is, as illustrated in FIG. 2 to FIG. 4, the first data layer DAT1 is disposed on the second interlayer insulation film 162. The first data layer DAT1 may be disposed on the same layer as the first data conductive layer in the display area DA. The first data layer DAT1 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may have a single-layered or multi-layered structure including them. For example, the first data layer DAT1 may have a triple-layered structure of a lower film containing a refractory metal such as molybdenum, chromium, tantalum, and titanium, or an alloy thereof; an interlayer film containing an aluminum-based metal, a silver-based metal, and a copper-based metal that have low resistivity; and an upper film containing a refractory metals such as molybdenum, chromium, tantalum, and titanium. a Referring to FIG. 2 to FIG. 4, the first data layer DAT1 may contact the third gate layer GAT3 in a data sub-opening OP_DAT1s disposed in the second interlayer insulation film 162. In addition, referring to FIG. 3, the first data layer DAT1 may contact the gate layer GAT1 in the data sub-opening OP_DAT1s disposed in the second interlayer insulation film 162 and in the first opening OP1 and the second opening OP2 disposed in the second gate insulation film 142 and the first interlayer insulation film 161. As illustrated in FIGS. 2-4 and elsewhere, the large data opening OP_DAT1 may include a plurality of smaller openings labeled as data sub-openings OP_DAT1s.

As such, some portions of the first data layer DAT1 may directly contact the third gate layer GAT3, and other portions thereof may directly contact the first gate layer GAT1.

Next, a second data layer DAT2 is disposed on the first data layer DAT1. The second data layer DAT2 may be disposed on the same layer as the second data conductive layer in the display area DA. The second data layer DAT2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may have a single-layered or multi-layered structure including them.

Figure 5:
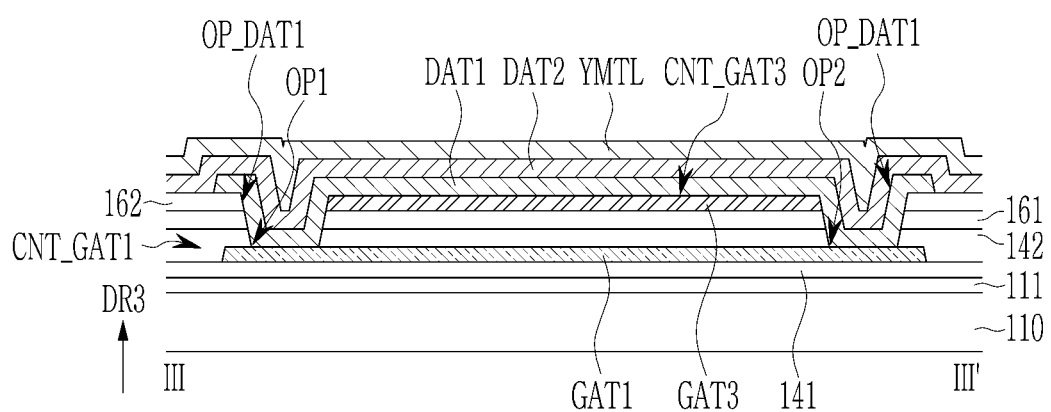
FIG. 5 illustrates the same cross-sectional view as FIG. 3 for a display device according to another embodiment.

FIG. 5 illustrates the same cross-sectional view as FIG. 3 for a display device according to another embodiment. Referring to FIG. 5, the display device according to the present embodiment may further include a touch electrode layer YMTL disposed on the second data layer DAT2. The touch electrode layer YMTL may be disposed on the same layer as a sensing electrode in the display area DA. In the case of the embodiment of FIG. 5, a touch panel may be embedded on the display panel.

As described above, the pad portion PA according to the present embodiment includes the third gate layer GAT3 overlapping the first gate layer GAT1, and a portion of the first gate layer GAT1 does not overlap the third gate layer GAT3. The first data layer DAT1 directly contacts the first gate layer GAT1 and the third gate layer GAT3, respectively.

It will be described later, but in the present embodiment, the display area DA may include both a polycrystalline semiconductor layer and an oxide semiconductor layer. In this case, a third gate conductive layer is added to drive the oxide semiconductor layer. When the third gate conductive layer is added, a step may increase due to addition of the third gate layer GAT3 in the pad portion. When the step increases, a conductive ball or the like may fall between steps in the pad portion, thereby causing a connection failure.

However, in the case of the display device according to the present embodiment, the third gate layer GAT3 is formed to overlap the first gate layer GAT1 in the third direction DR3 in the pad portion. Accordingly, the third gate layer GAT3 acts as an etch stopper, so that only an insulation film on the third gate layer GAT3 is etched in an area in which the third gate layer GAT3 is formed. Therefore, the second gate insulation film 142 and the first interlayer insulation film 161 between the first gate layer GAT1 and the third gate layer GAT3 are not etched, and a step may be reduced by such an insulation film structure. In addition, a portion of the first gate layer GAT1 does not overlap the third gate layer GAT3 in the third direction DR3, and the first data layer DAT1 and the first gate layer GAT1 directly contact each other in the corresponding area.

That is, the main configuration of the present invention is a structure in which the third gate layer GAT3 is disposed to partially overlap the first gate layer GAT1, and the first data layer DAT1 and the third gate layer GAT3 directly contact each other in the overlapping area; and a portion of the first gate layer GAT1 does not overlap the third gate layer GAT3, while the first gate layer GAT1 and the first data layer DAT1 directly contact each other in the corresponding non-overlapping area.

In this case, the non-overlapping area of the first gate layer GAT1 and the third gate layer GAT3 may be formed by allowing a planar area of the third gate layer GAT3 to be smaller than that of the first gate layer GAT1, or by forming an opening in the third gate layer GAT3.

FIG. 6 to FIG. 20 illustrate contact relationships of the first data layer DAT1, the first gate layer GAT1, and the third gate layer GAT3 according to various embodiments. However, FIG. 6 to FIG. 20 are only examples, and the present invention is not limited thereto.

Figure 6:
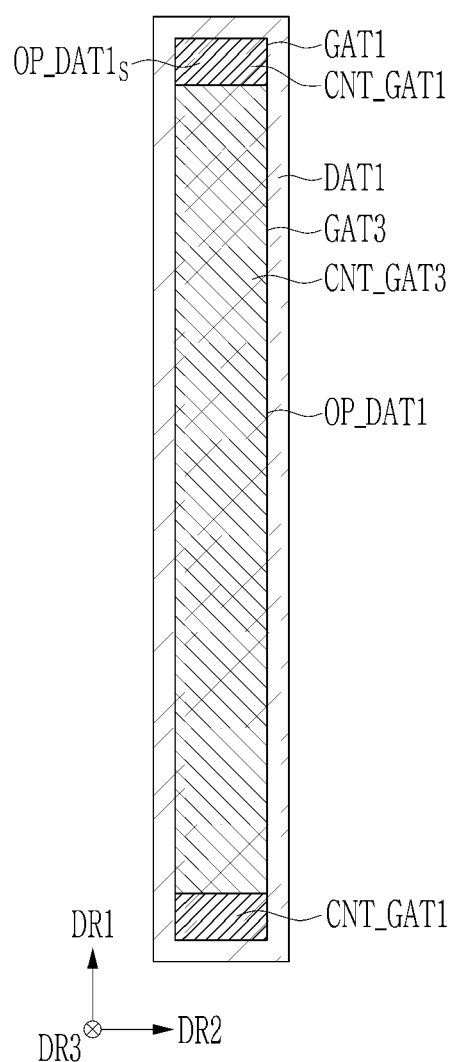
FIG. 6 illustrates a contact relationship of a first data layer, a first gate layer, and a third gate layer according to various embodiments.

Referring to FIG. 6, the first data layer DAT1 contacts the first gate layer GAT1 and the third gate layer GAT3 in the data opening OP_DAT1 at the data sub-openings OP_DAT1s. at the data sub-openings OP_DAT1s. An area in which the first data layer DAT1 contacts the first gate layer GAT1 is indicated as a first contact area CNT_GAT1, and an area in which the first data layer DAT1 contacts the third gate layer GAT3 is indicated as a second contact area CNT_GAT3. In FIG. 6, only some areas of the first gate layer GAT1 and the third gate layer GAT3 are illustrated. That is, in the first gate layer GAT1 and the third gate layer GAT3, only areas within the data opening OP_DAT1 are illustrated, and only a portion of the first gate layer GAT1 that does not overlap with the third gate layer GAT3 is illustrated. Although not illustrated, the third gate layer GAT3 overlaps the first gate layer GAT1 in the third direction DR3. As illustrated in FIG. 6, a length of the third gate layer GAT3 in a first direction DR1 may be shorter than that of the first gate layer GAT1 in the first direction DR1, and the first contact area CNT_GAT1 may be disposed at both edges of the second contact area CNT_GAT3 in the first direction DR1. In this case, a sum of all areas of the first contact areas CNT_GAT1 may be 1.5 $\mu m^2$ or more. This is a minimum area to stably connect the first data layer DAT1 and the first gate layer GAT1, and when the sum of all areas of the first contact areas CNT_GAT1 is 1.5 $\mu m^2$ or less, a connection failure between the first data layer DAT1 and the first gate layer GAT1 may occur.

In addition, in FIG. 6, a width of a shortest portion of each of the first contact areas CNT_GAT1 may be 20 $\mu m$ or less. The first contact area CNT_GAT1 is an area positioned in the step portion as illustrated in FIG. 3, and when the width of the shortest portion of the first contact area CNT_GAT1 is 20 $\mu m$ or more, a conductive ball may fall into the step portion.

The descriptions of the shortest width of the first contact area CNT_GAT1 and of the sum of the areas of the first contact areas CNT_GAT1 described in FIG. 6 are also applied to FIG. 7 to FIG. 20 below.

Figure 7:
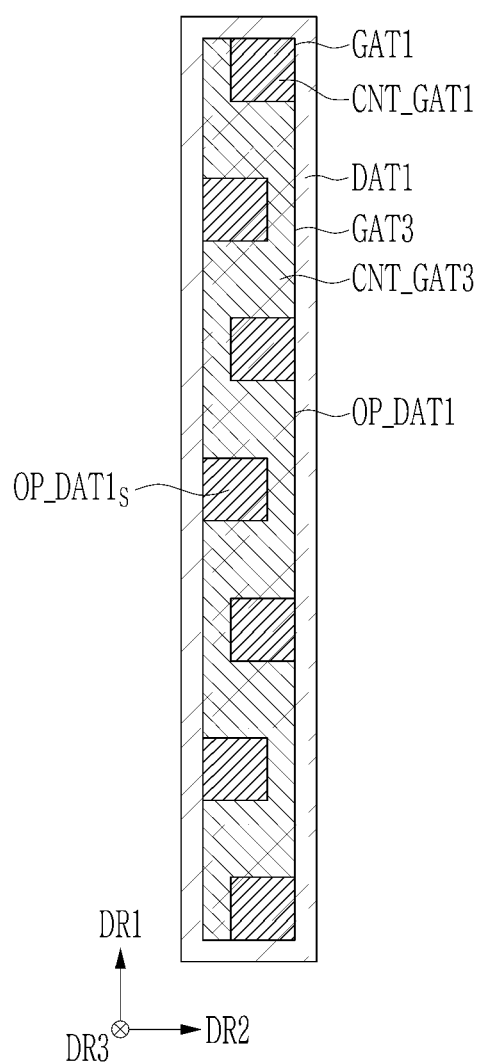
FIG. 7 illustrates a plurality of first contact areas having a quadrangular shape and are spaced apart from each other in accordance with another embodiment of the inventive concepts.

FIG. 7 illustrates the same area as that of FIG. 6 with respect to another embodiment. Detailed descriptions of the same constituent elements as those of FIG. 6 will be omitted. Referring to FIG. 7, a plurality of first contact areas CNT-_GAT1 have a quadrangular shape, and are spaced apart from each other. As illustrated in FIG. 7, the first contact areas CNT_GAT1 may be alternately disposed on opposing sides of the data opening OP_DAT1 facing each other. However, as illustrated in FIG. 7, the second contact area CNT_GAT3 is not separated in plural and is formed as one continuous contact. In the embodiment of FIG. 7, the shape of the third gate layer GAT3 is the same as that of the second contact area CNT_GAT3. That is, the third gate layer GAT3 may have a serpentine-shaped structure having alternately recessed portions in the second direction DR2. In this case, a sum of all areas of the first contact areas CNT_GAT1 may be 1.5 $\mu m^2$ or more. In addition, a shortest width of each of the first contact areas CNT_GAT1 may be 20 $\mu m$ or less.

Figure 8:
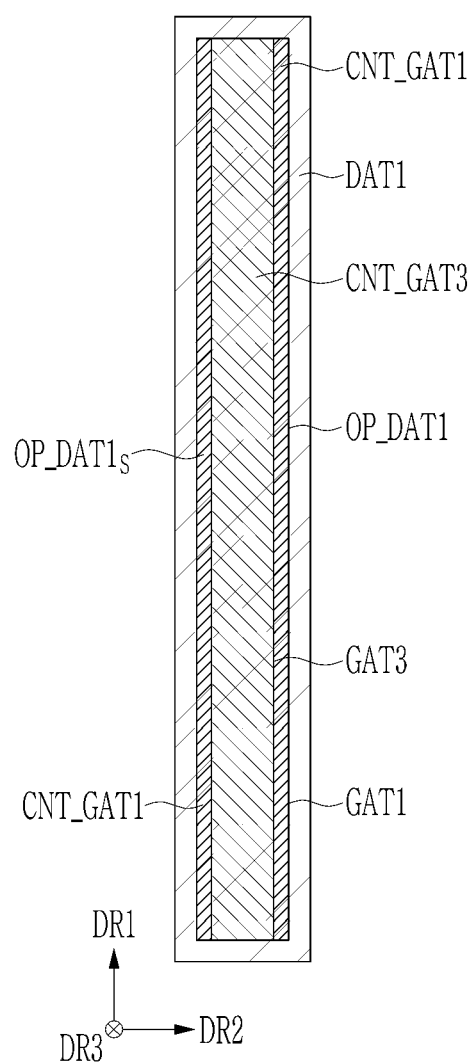
FIG. 8 illustrates a first contact area disposed at both sides of a second contact area in a length direction in accordance with another embodiment of the inventive concepts.

FIG. 8 illustrates the same area as that of FIG. 6 with respect to another embodiment. Detailed descriptions of the same constituent elements as those of FIG. 6 will be omitted. Referring to FIG. 8, the first contact area CNT_GAT1 is disposed at both sides of the second contact area CNT_GAT3 in a length direction (first direction DR1), such as on opposing long sides thereof. In this case, a sum of all areas of the first contact areas CNT_GAT1 may be 1.5 µm2 or more. In addition, a shortest width of each of the first contact areas CNT_GAT1 may be 20 µm or less. In the embodiment of FIG. 8, the shape of the third gate layer GAT3 is the same as that of the second contact area CNT_GAT3. Therefore, in the embodiment of FIG. 8, a width of the third gate layer GAT3 in the second direction DR2 may be narrower than a width of the first gate layer GAT1 in the second direction DR2.

Figure 9:
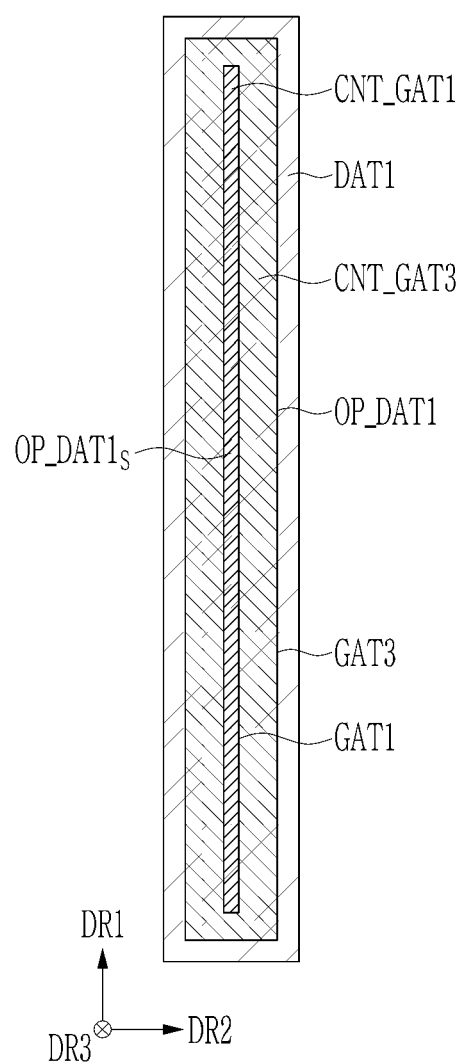
FIG. 9 illustrates a long data sub-opening disposed in a center of the third gate layer along the first direction in accordance with another embodiment of the inventive concepts.

FIG. 9 illustrates the same area as that of FIG. 6 with respect to another embodiment. Detailed descriptions of the same constituent elements as those of FIG. 6 will be omitted. Referring to FIG. 9, a long data sub-opening OP_DAT1s is disposed in a center of the third gate layer GAT3 along the first direction DR1, and the first gate layer GAT1 and the first data layer DAT1 are in contact in the data opening OP_DAT1. That is, the first contact area CNT_GAT1 is disposed along a long center of the second contact area CNT_GAT3 in the first direction DR1. In the embodiment of FIG. 9, an area of the first contact area CNT_GAT1 may be 1.5 µm2 or more. A shortest width of the first contact areas CNT_GAT1 may be 20 µm or less.

Figure 10:
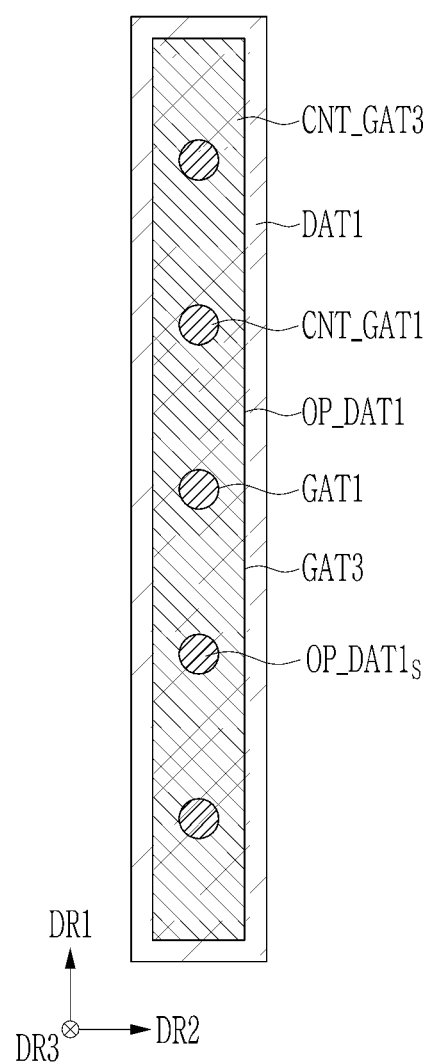
FIG. 10 illustrates a plurality of circular data sub-openings disposed in a center of the third gate layer along the first direction in accordance with another embodiment of the inventive concepts.

FIG. 10 illustrates the same area as that of FIG. 6 with respect to another embodiment. Detailed descriptions of the same constituent elements as those of FIG. 6 will be omitted. Referring to FIG. 10, a plurality of circular data sub-openings OP_DAT1s are disposed in a center of the third gate layer GAT3 along the first direction DR1, and the first gate layer GAT1 and the first data layer DAT1 are in contact in the data sub-openings OP_DAT1s of the data opening OP_DAT1 are disposed in a center of the third gate layer GAT3 along the first direction DR1, and the first gate layer GAT1 and the first data layer DAT1 are in contact in the data sub-openings OP_DAT1s of the data opening OP_DAT1. That is, a plurality of first circular contact areas CNT_GAT1 are disposed, and the second contact area CNT_GAT3 is disposed around the first circular contact areas CNT_GAT1.

The plurality of circular data sub-openings OP_DAT1s extend a length of the third gate layer GAT3 in the first direction DR1. Five circular data sub-openings OP_DAT1s are illustrated, but embodiments are not limited thereto. More or less data sub-openings OP_DAT1s of different sizes may be implemented depending on a number of connections to be made therethrough.

Figure 11:
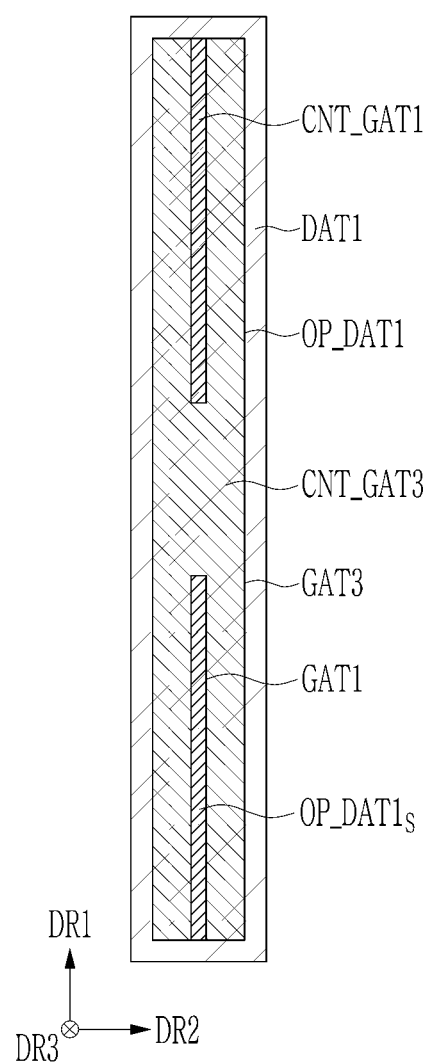
FIG. 11 illustrates a plurality of data sub-openings disposed to be spaced apart from each other in a center of the third gate layer along the first direction in accordance with another embodiment of the inventive concepts.

FIG. 11 illustrates the same area as that of FIG. 6 with respect to another embodiment. Detailed descriptions of the same constituent elements as those of FIG. 6 will be omitted. Referring to FIG. 11, a plurality of data sub-openings OP_DAT1s are disposed to be spaced apart from each other in a center of the third gate layer GAT3 along the first direction DR1, and the first gate layer GAT1 and the first data layer DAT1 are in contact in the plurality of data sub-openings OP_DAT1s of the data opening OP_DAT1. The plurality of data sub-openings OP_DAT1s may be a first and second data sub-opening that are spaced apart from each other by a predetermined distance. The plurality of data sub-openings OP_DAT1s may be a first and second data sub-opening that are spaced apart from each other by a predetermined distance. That is, the first contact area CNT_GAT1 is disposed along a center of the second contact area CNT_GAT3. In the embodiment of FIG. 11, a sum of areas of the first contact areas CNT_GAT1 may be 1.5 µm2 or more. In addition, a shortest width of each of the first contact areas CNT_GAT1 may be 20 µm or less.

Figure 12:
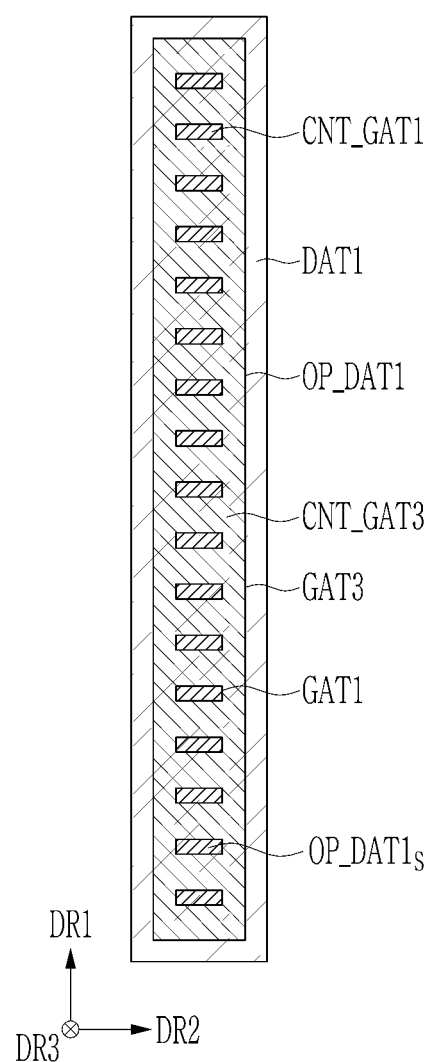
FIG. 12 illustrates a plurality of data sub-openings disposed in the third gate layer along the first direction in accordance with another embodiment of the inventive concepts.

FIG. 12 illustrates the same area as that of FIG. 6 with respect to another embodiment. Detailed descriptions of the same constituent elements as those of FIG. 6 will be omitted. Referring to FIG. 12, a plurality of data sub-openings OP_DAT1s are disposed in the third gate layer GAT3 along the first direction DR1, and the first gate layer GAT1 and the first data layer DAT1 are in contact in the plurality of data sub-openings OP_DAT1s in the data opening OP_DAT1 . . . 12, a plurality of data sub-openings OP_DAT1s are disposed in the third gate layer GAT3 along the first direction DR1, and the first gate layer GAT1 and the first data layer DAT1 are in contact in the plurality of data sub-openings OP_DAT1s in the data opening OP_DAT1. That is, a plurality of the first contact areas CNT_GAT1 are disposed to be spaced apart from each other along the first direction DR1. In the embodiment of FIG. 12, a sum of areas of the first contact areas CNT_GAT1 may be 1.5 µm2 or more. In addition, a shortest width of each of the first contact areas CNT_GAT1 may be 20 µm or less.

Figure 13:
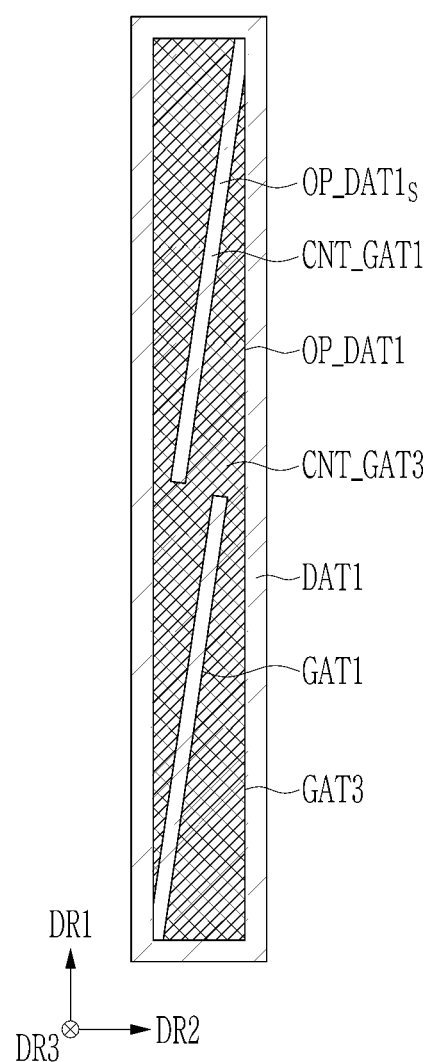
FIG. 13 illustrates a plurality of data sub-openings disposed in the third gate layer in a direction oblique to the first direction FIG. 14 in accordance with another embodiment of the inventive concepts.

FIG. 13 illustrates the same area as that of FIG. 6 with respect to another embodiment. Detailed descriptions of the same constituent elements as those of FIG. 6 will be omitted. Referring to FIG. 13, a plurality of data sub-openings OP_DAT1s are disposed in the third gate layer GAT3 in a direction oblique to the first direction DR1 and the second direction DR2, and the first gate layer GAT1 and the first data layer DAT1 are in contact in the plurality of data sub-openings OP_DAT1s in the data opening OP_DAT1. That is, a plurality of the first contact areas CNT_GAT1 are disposed along a direction that is oblique to first direction DR1 and second direction DR2. In the embodiment of FIG. 13, a sum of areas of the first contact areas CNT_GAT1 may be 1.5 µm2 or more. In addition, a shortest width of the first contact area CNT_GAT1 may be 20 µm or less.

Figure 14:
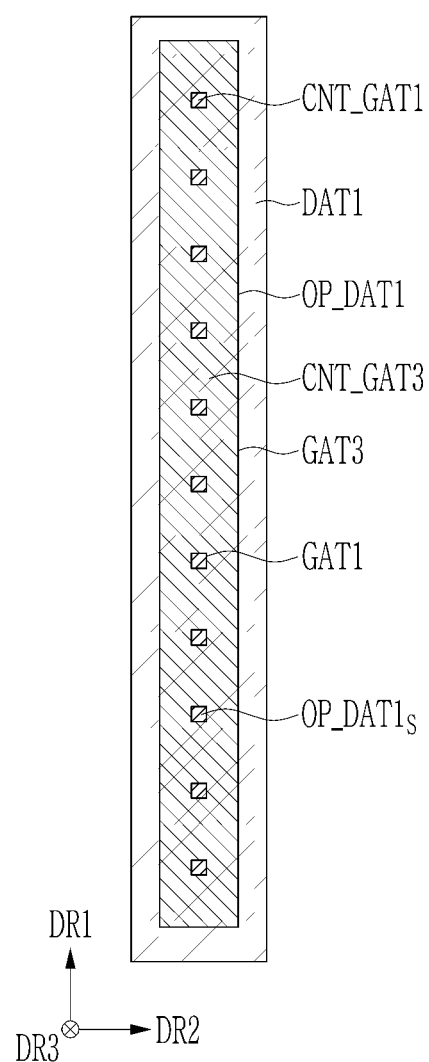
FIG. 14 illustrates a plurality of quadrangular data sub-openings OP_DAT1s are disposed in the third gate layer in accordance with another embodiment of the inventive concepts.

FIG. 14 illustrates the same area as that of FIG. 6 with respect to another embodiment. Detailed descriptions of the same constituent elements as those of FIG. 6 will be omitted. Referring to FIG. 14, a plurality of quadrangular data sub-openings OP_DAT1s are disposed in the third gate layer GAT3, and the first gate layer GAT1 and the first data layer DAT1 are in contact in the plurality of quadrangular data sub-openings OP_DAT1s in the data opening OP_DAT1. That is, a plurality of first quadrangular contact areas CNT_GAT1 are disposed, and the second contact area CNT_GAT3 is disposed around the first circular contact areas CNT_GAT1. In this case, a sum of all areas of the first contact areas CNT_GAT1 may be 1.5 µm2 or more. In addition, a shortest width of each of the first contact areas CNT_GAT1 may be 20 µm or less.

Figure 15:
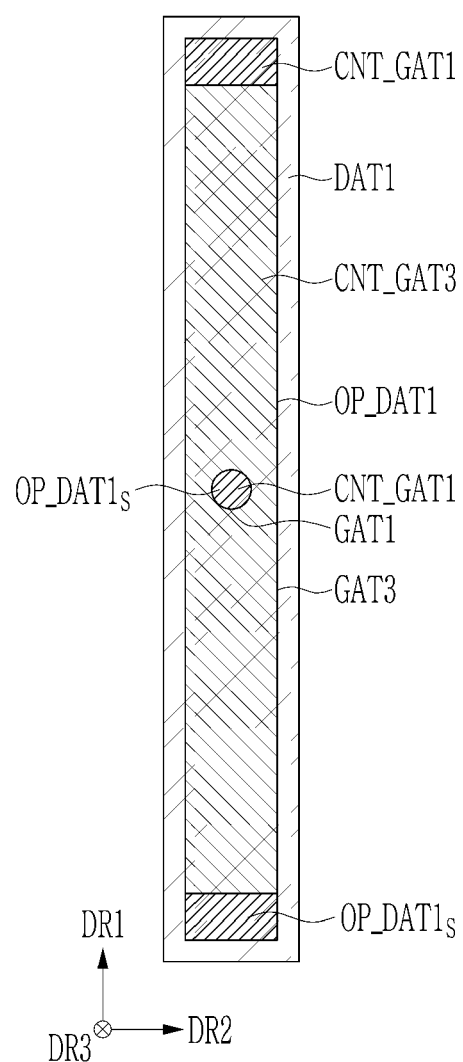
FIG. 15 illustrates a circular data sub-opening disposed in the third gate layer in accordance with another embodiment of the inventive concepts.

FIG. 15 illustrates the same area as that of FIG. 6 with respect to another embodiment. Detailed descriptions of the same constituent elements as those of FIG. 6 will be omitted. Referring to FIG. 15, in addition to the structure of FIG. 6, a circular data sub-opening OP_DAT1s is disposed in the third gate layer GAT3 in addition to opposing data sub-openings OP_DAT1s at either end of the data opening OP_DAT1, and the first gate layer GAT1 and the first data layer DAT1 are in contact in the plurality of data sub-openings OP_DAT1s in the data opening OP_DAT1. That is, the first contact area CNT_GAT1 may be disposed at both edges of the second contact area CNT_GAT3 in the first direction DR1 and near a center of the second contact area CNT_GAT3. In this case, a sum of all areas of the first contact areas CNT_GAT1 may be 1.5 µm2 or more. In addition, a shortest width of each of the first contact areas CNT_GAT1 may be 20 µm or less.

Figure 16:
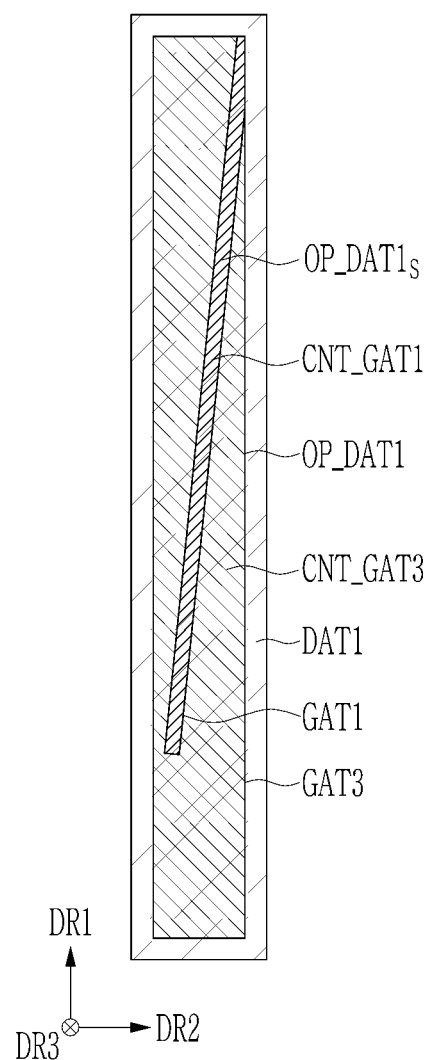
FIG. 16 illustrates a data sub-opening disposed in the third gate layer in a direction oblique to the first direction in accordance with another embodiment of the inventive concepts.

FIG. 16 illustrates the same area as that of FIG. 6 with respect to another embodiment. Detailed descriptions of the same constituent elements as those of FIG. 6 will be omitted. Referring to FIG. 16, a data sub-opening OP_DAT1s is disposed in the third gate layer GAT3 in a direction oblique to the first direction DR1 and the second direction DR2, and the first gate layer GAT1 and the first data layer DAT1 are in contact in the data sub-opening OP_DAT1s in the data openings OP_DAT1. That is, the first contact area CNT_GAT1 are disposed long along a direction that is oblique to first direction DR1 and second direction DR2. In the embodiment of FIG. 16, an area of the first contact area CNT_GAT1 may be 1.5 µm2 or more. In addition, a shortest width of the first contact area CNT_GAT1 may be 20 µm or less.

Figure 17:
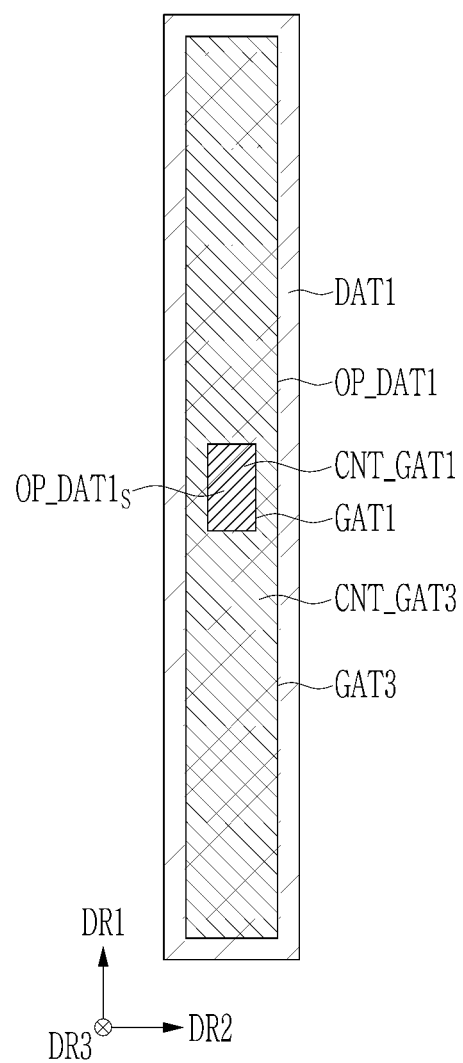
FIG. 17 illustrates a quadrangular data sub-opening disposed in the third gate layer in accordance with another embodiment of the inventive concepts.

FIG. 17 illustrates the same area as that of FIG. 6 with respect to another embodiment. Detailed descriptions of the same constituent elements as those of FIG. 6 will be omitted. Referring to FIG. 17, a quadrangular data sub-opening OP_DAT1s is disposed in the third gate layer GAT3, and the first gate layer GAT1 and the first data layer DAT1 are in contact in the data sub-opening OP_DAT1s in the data openings OP_DAT1. That is, the first contact area CNT_GAT1 is disposed as a quadrangle, and the second contact area CNT_GAT3 is disposed around the first contact area CNT_GAT1. In this case, an area of the first contact area CNT_GAT1 may be 1.5 µm2 or more. In addition, a shortest width of the first contact area CNT_GAT1 may be 20 µm or less.

Figure 18:
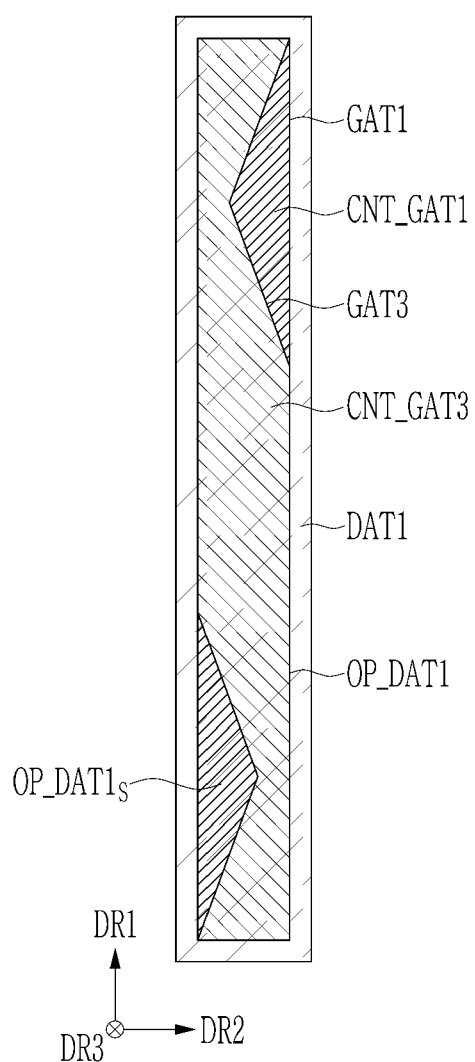
FIG. 18 illustrates the third gate layer having a triangle-shaped groove in accordance with another embodiment of the inventive concepts.

FIG. 18 illustrates the same area as that of FIG. 6 with respect to another embodiment. Detailed descriptions of the same constituent elements as those of FIG. 6 will be omitted. Referring to FIG. 18, the third gate layer GAT3 may include a triangle-shaped groove. The first gate layer GAT1 and the first data layer DAT1 are in contact in the groove. That is, the first contact area CNT_GAT1 may be disposed as a triangle. In this case, a sum of areas of the first contact areas CNT_GAT1 may be 1.5 µm2 or more. In addition, a shortest width of the first contact area CNT_GAT1 may be 20 µm or less.

Figure 19:
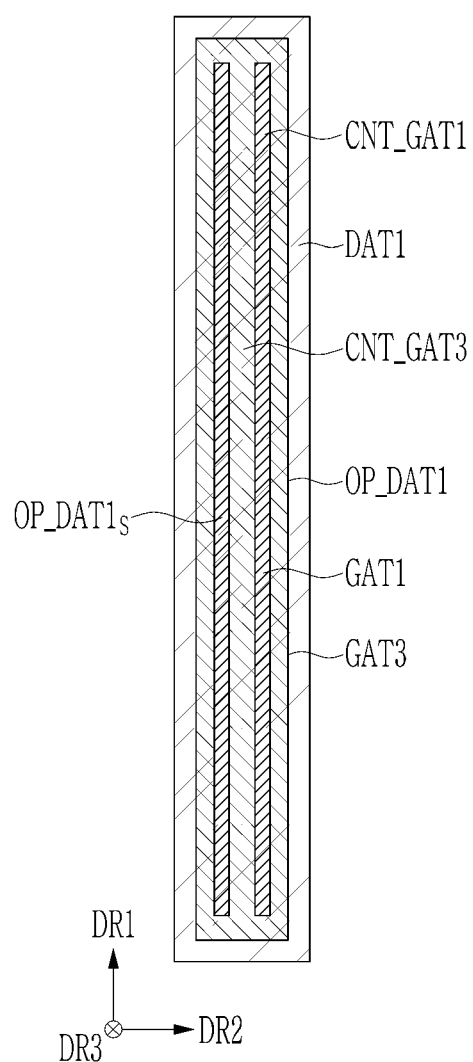
FIG. 19 illustrates the third gate layer including a plurality of data sub-openings disposed along the first direction in accordance with another embodiment of the inventive concepts.

FIG. 19 illustrates the same area as that of FIG. 6 with respect to another embodiment. Detailed descriptions of the same constituent elements as those of FIG. 6 will be omitted. Referring to FIG. 19, the third gate layer GAT3 may include a plurality of data sub-openings OP_DAT1s disposed along the first direction DR1. The first gate layer GAT1 and the first data layer DAT1 are in contact in the data sub-openings OP_DAT1s in the data openings OP_DAT1. That is, the first contact area CNT_GAT1 may be disposed long in plural along the first direction DR1. In this case, a sum of areas of the first contact areas CNT_GAT1 may be 1.5 µm2 or more. In addition, a shortest width of the first contact area CNT_GAT1 may be 20 µm or less.

Figure 20:
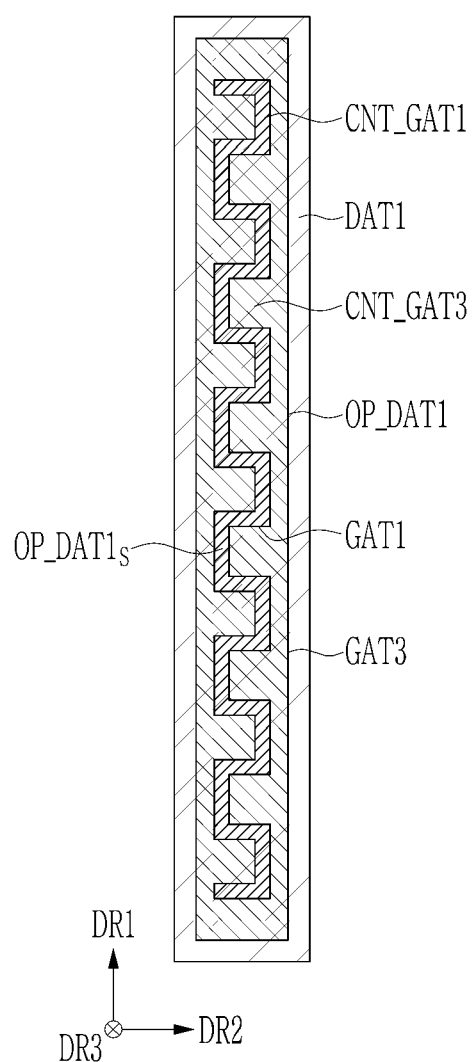
FIG. 20 illustrates the third gate layer including a data sub-opening OP_DAT1s extended and disposed in zigzag shape along the first direction in accordance with another embodiment of the inventive concepts.

FIG. 20 illustrates the same area as that of FIG. 6 with respect to another embodiment. Detailed descriptions of the same constituent elements as those of FIG. 6 will be omitted. Referring to FIG. 20, the third gate layer GAT3 may include a data sub-opening OP_DAT1s extended and disposed in zigzag shape along the first direction DR1 and the second direction DR2. The first gate layer GAT1 and the first data layer DAT1 are in contact in the data sub-opening OP_DAT1s in the data openings OP_DAT1. In this case, an area of the first contact area CNT_GAT1 may be 1.5 µm2 or more. In addition, a shortest width of the first contact area CNT_GAT1 may be 20 µm or less.

In the embodiments of FIG. 6 to FIG. 20, an area occupied by the second contact area CNT_GAT3 among the entire area of the data opening OP_DAT1 may be 30% or more. When the area occupied by the second contact area CNT_GAT3 is 30% or less, because this means that the area in which the third gate layer GAT3 is formed is substantially small, a step compensation effect by the formation of the third gate layer GAT3 may be insignificant.

Figure 21:
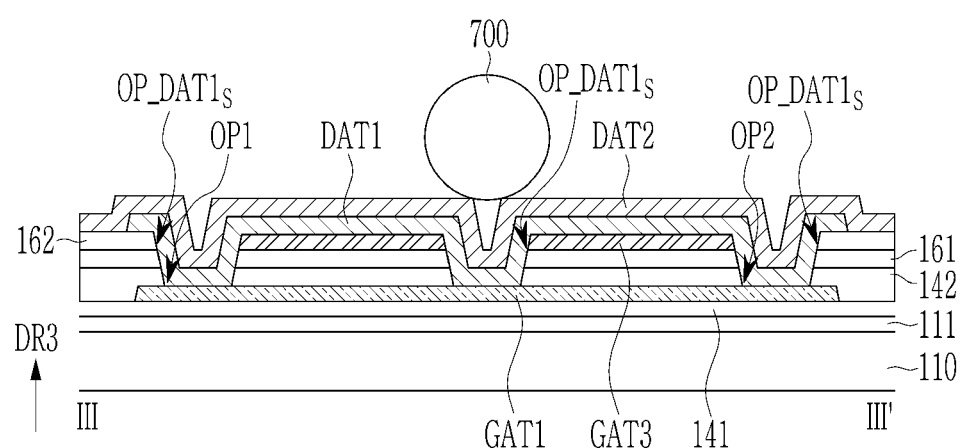
FIG. 21 illustrates a cross-sectional view of a state in which a conductive ball is fixed by an opening formed in a third gate layer.

In the embodiments of FIG. 6 to FIG. 20, one of positions of the data sub-openings OP_DAT1s formed in the third gate layer GAT3 may fix a position of a conductive ball 700. FIG. 21 illustrates a cross-sectional view of a state in which the conductive ball 700 is fixed by a data sub-opening OP_DAT1s formed in the third gate layer GAT3. As illustrated in FIG. 6 to FIG. 20, the shortest width of the opening of the third gate layer GAT3, that is, the shortest width of the first contact area CNT_GAT1 in which the first gate layer GAT1 and the first data layer DAT1 are in contact is 20 µm. Therefore, the conductive ball 700 does not fall into a space of the data sub-opening OP_DAT1s, and the position thereof may be fixed by the data sub-opening OP_DAT1s. The conductive ball 700 is randomly positioned on the pad portion, and as illustrated in FIG. 21, while being caught in the data opening OP_DAT1 of the third gate layer GAT3, the position thereof may be fixed. This may induce an even distribution of the conductive balls 700 during a chip on package (COP) process.

Hereinafter, a structure of the display area DA of the display device according to the present embodiment will be described with reference to FIG. 22 to FIG. 30. However, the structure described below is only an example, and the present invention is not limited thereto.

Figure 22:
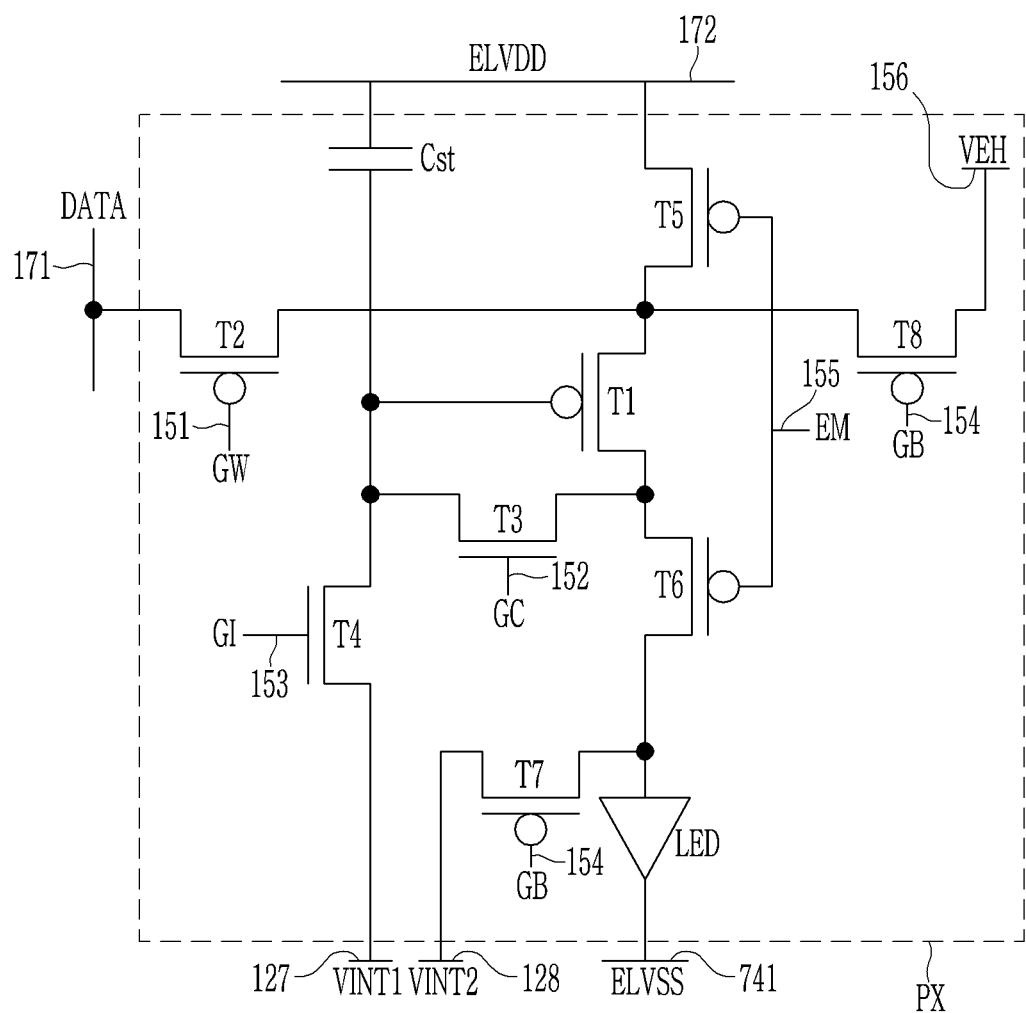
FIG. 22 illustrates a circuit diagram of one pixel of a display device according to an embodiment.

FIG. 22 illustrates a circuit diagram of one pixel of a display device according to an embodiment.

As illustrated in FIG. 22, one pixel PX of the display device according to the embodiment includes a plurality of transistors T1, T2, T3, T4, T5, T6, T7, and T8 connected to several signal lines, a storage capacitor Cst, and a light emitting diode LED.

The plurality of signal lines 127, 128, 151, 152, 153, 154, 155, 156, 171, 172, and 741 are connected to one pixel PX. The plurality of signal lines includes a first initialization voltage line 127, a second initialization voltage line 128, a first scan line 151, a second scan line 152, an initialization control line 153, a bypass control line 154, a light emission control line 155, a reference voltage line 156, a data line 171, a driving voltage line 172, and a common voltage line 741.

The first scan line 151 is connected to a gate driver (not illustrated) to transmit a first scan signal GW to the second transistor T2. The second scan line 152 may be applied with a voltage of an opposite polarity to a voltage applied to the first scan line 151 at the same timing as that of a signal of the first scan line 151. For example, when a high voltage is applied to the first scan line 151, a low voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh transistor T7 and the eighth transistor T8. The bypass control line 154 may include the next first scan line 151. The light emission control line 155 transmits a light emission control signal EM to the fifth transistor T5 and the sixth transistor T6.

The data line 171 is a wire that transmits a data voltage DATA generated by a data driver (not illustrated), and luminance emitted by the light emitting diode LED is changed according to the data voltage DATA applied to the pixel PX.

The driving voltage line 172 applies a driving voltage ELVDD, and the reference voltage line 156 applies a reference voltage VEH. The first initialization voltage line 127 transmits a first initialization voltage VINT1, and the second initialization voltage line 128 transmits a second initialization voltage VINT2. The common voltage line 741 applies the common voltage ELVSS to a cathode electrode of the light emitting diode LED. In the present embodiment, each of voltages applied to the driving voltage line 172, the reference voltage line 156, the first and second initialization voltage lines 127 and 128, and the common voltage line 741 may be constant voltages.

Hereinafter, a structures and a connection relationship of the plurality of transistors will be described in detail.

The driving transistor T1 may have characteristics of a p-type transistor, and may include a polycrystalline semiconductor. The driving transistor T1 may receive the data voltage DATA according to a switching operation of the second transistor T2 to supply a driving current to an anode electrode of the light emitting diode LED. Because brightness of the light emitting diode LED is adjusted according to an amount of a driving current outputted to the anode electrode of the light emitting diode LED, luminance of the light emitting diode LED may be adjusted according to the data voltage DATA applied to the pixel PX. For this purpose, a first area of the driving transistor T1 is disposed to receive the driving voltage ELVDD, and is connected to the driving voltage line 172 via the fifth transistor T5. In addition, the first area of the driving transistor T1 is connected to a second area of the second transistor T2 to receive the data voltage DATA. Meanwhile, a second area of the driving transistor T1 is disposed to output a current toward the light emitting diode LED, and is connected to the anode electrode of the light emitting diode LED via the sixth transistor T6. In addition, the second area of the driving transistor T1 transmits the data voltage DATA applied to the first area thereof to the third transistor T3. Meanwhile, a gate electrode of the driving transistor T1 is connected to one electrode of the storage capacitor Cst (hereinafter referred to as a second storage electrode). Accordingly, a voltage of the gate electrode of the driving transistor T1 is changed according to a voltage stored in the storage capacitor Cst, and therefore, a driving current outputted from the driving transistor T1 is changed. In addition, the storage capacitor Cst serves to maintain the voltage of the gate electrode of the driving transistor T1 constant for one frame.

The second transistor T2 may have characteristics of a p-type transistor, and may include a polycrystalline semiconductor. The second transistor T2 is a transistor that allows the data voltage DATA to be received into the pixel PX. A gate electrode of the second transistor T2 is connected to the first scan line 151. A first area of the second transistor T2 is connected to the data line 171. A second area of the second transistor T2 is connected to the first area of the driving transistor T1. When the second transistor T2 is turned on by a low voltage of the first scan signal GW transmitted through the first scan line 151, the data voltage DATA transmitted through the data line 171 is transmitted to the first area of the driving transistor T1.

The third transistor T3 may have characteristics of an n-type transistor, and may include an oxide semiconductor. The third transistor T3 electrically connects the second area of the driving transistor T1 and the gate electrode of the driving transistor T1. As a result, it is a transistor that allows a compensation voltage changed as the data voltage DATA passes through the driving transistor T1 to be transmitted to the second storage electrode of the storage capacitor Cst. A gate electrode of the third transistor T3 is connected to the second scan line 152, and a first area of the third transistor T3 is connected to the second area of the driving transistor T1. A second area of the third transistor T3 is connected to the second storage electrode of the storage capacitor Cst and the gate electrode of the driving transistor T1. The third transistor T3 is turned on by a high voltage of the second scan signal GC transmitted through the second scan line 152 to connect the gate electrode of the driving transistor T1 and the second area of the driving transistor T1, and to allow a voltage applied to the gate electrode of the driving transistor T1 to be transmitted to the second storage electrode of the storage capacitor Cst to be stored in the storage capacitor Cst.

The fourth transistor T4 may have characteristics of an n-type transistor, and may include an oxide semiconductor. The fourth transistor T4 initializes the gate electrode of the driving transistor T1 and the second storage electrode of the storage capacitor Cst. A gate electrode of the fourth transistor T4 is connected to the initialization control line 153, and a first area of the fourth transistor T4 is connected to the first initialization voltage line 127. A second area of the fourth transistor T4 is connected to the second storage electrode of the storage capacitor Cst and the gate electrode of the driving transistor T1 via the second area of the third transistor T3. The fourth transistor T4 is turned on by a high voltage of the initialization control signal GI received through the initialization control line 153, and at this time, the first initialization voltage VINT1 is transmitted to the gate electrode of the driving transistor T1 and the second storage electrode of the storage capacitor Cst. Accordingly, a voltage of the gate electrode of the driving transistor T1 and the storage capacitor Cst is initialized.

The fifth transistor T5 may have characteristics of a p-type transistor, and may include a polycrystalline semiconductor. The fifth transistor T5 serves to transmit the driving voltage ELVDD to the driving transistor T1. A gate electrode of the fifth transistor T5 is connected to the light emission control line 155, a first area of the fifth transistor T5 is connected to the driving voltage line 172, and a second area of the fifth transistor T5 is connected to the first area of the driving transistor T1.

The sixth transistor T6 may have characteristics of a p-type transistor, and may include a polycrystalline semiconductor. The sixth transistor T6 serves to transmit a driving current outputted from the driving transistor T1 to the light emitting diode LED. A gate electrode of the sixth transistor T6 is connected to the light emission control line 155, a first area of the sixth transistor T6 is connected to the second area of the driving transistor T1, and a second area of the sixth transistor T6 is connected to the anode of the light emitting diode LED.

The seventh transistor T7 may have characteristics of a p-type transistor, and may include a polycrystalline semiconductor. The seventh transistor T7 serves to initialize the anode of the light emitting diode LED. A gate electrode of the seventh transistor T7 is connected to the bypass control line 154, a first area of the seventh transistor T7 is connected to the anode of the light emitting diode LED, and a second area of the seventh transistor T7 is connected to the second initialization voltage line 128. When the seventh transistor T7 is turned on by a low voltage of the bypass signal GB, the second initialization voltage VINT2 is applied to the anode of the light emitting diode LED to initialize it.

The eighth transistor T8 may have characteristics of a p-type transistor, and may include a polycrystalline semiconductor. A gate electrode of the eighth transistor T8 is connected to the bypass control line 154, a first area of the eighth transistor T8 is connected to the reference voltage line 156, and a second area of the eighth transistor T8 is connected to the first area of the driving transistor T1. When the eighth transistor T8 is turned on by a low voltage of the bypass signal GB, the reference voltage VEH is applied to the first area of the driving transistor T1.

In the above, it has been described that one pixel includes eight transistors T1 to T8 and one storage capacitor Cst, but the present invention is not limited thereto, and the number of transistors, the number of capacitors, and their connection relationships may be variously changed.

In the present embodiment, the driving transistor T1 may include a polycrystalline semiconductor. In addition, the third transistor T3 and the fourth transistor T4 may include an oxide semiconductor. The second transistor T2, the fifth transistor T5, the sixth transistor T6, the seventh transistor T7, and the eighth transistor T8 may include a polycrystalline semiconductor. However, the present invention is not limited thereto, and at least one of the second transistor T2, the fifth transistor T5, the sixth transistor T6, the seventh transistor T7, and the eighth transistor T8 may include an oxide semiconductor. In the present embodiment, by making the third transistor T3 and the fourth transistor T4 contain a semiconductor material different from the driving transistor T1, they may be more stably driven, and their reliability may be improved.

Hereinafter, planar and cross-sectional structures of the driving transistor T1, the third transistor T3, and the fourth transistor T4 will be further described with reference to FIG. 23 to FIG. 30.

Figure 23:
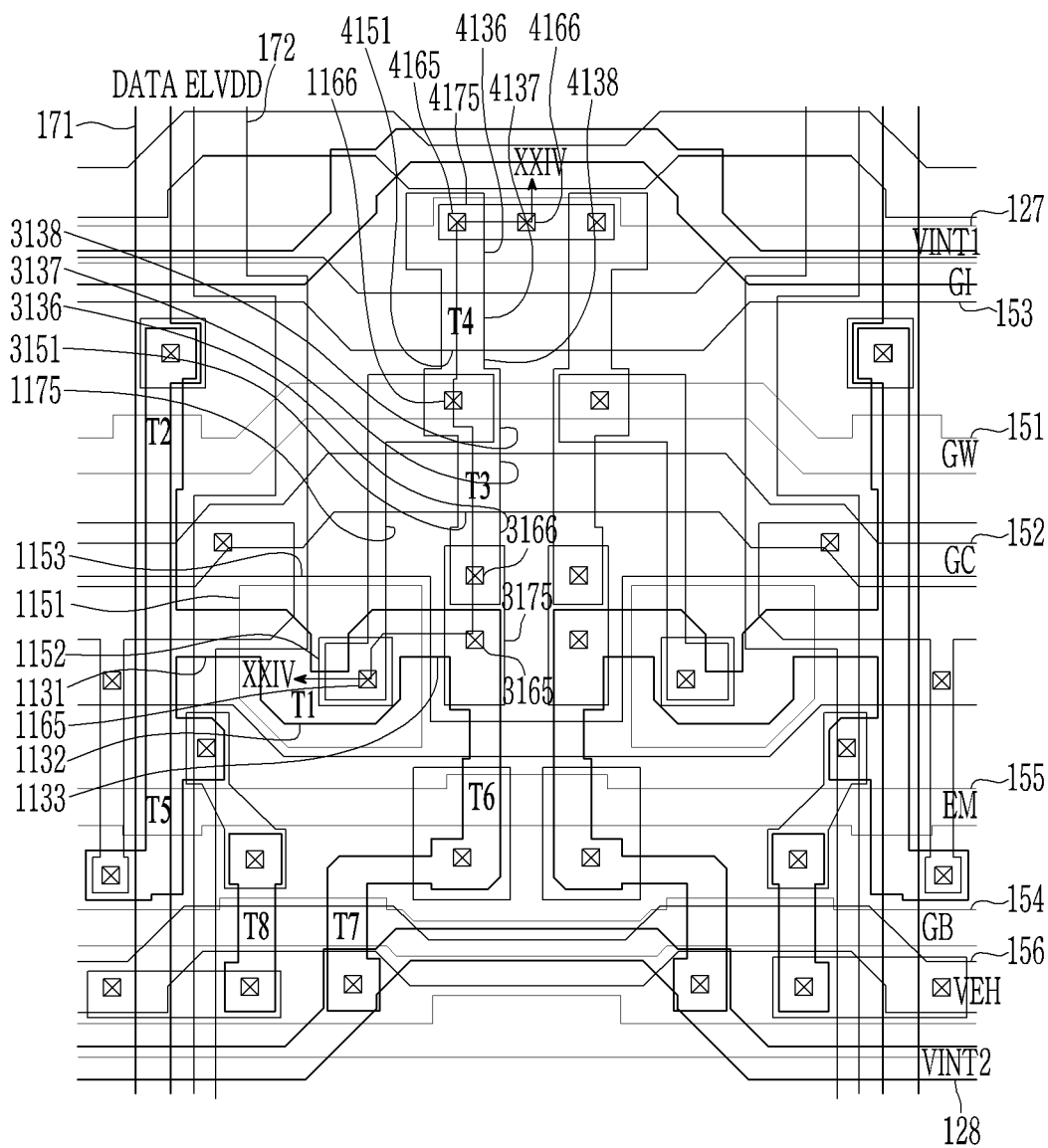
FIG. 23 illustrates a top plan view of a display device according to an embodiment.
Figure 24:
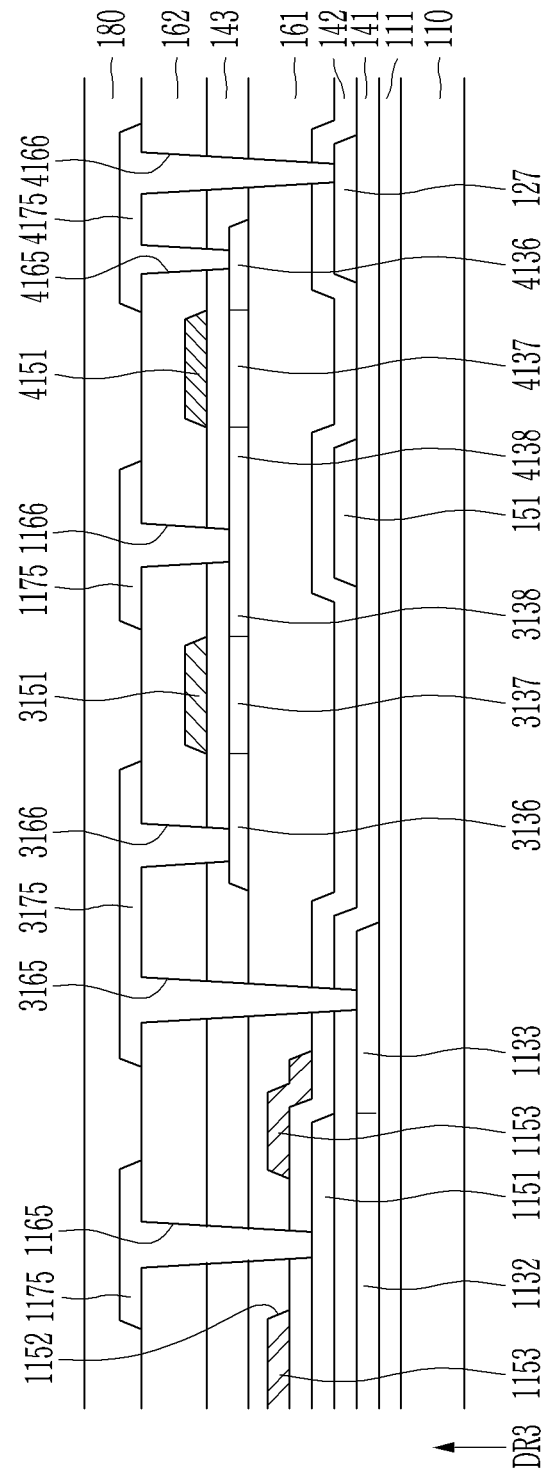
FIG. 24 illustrates a cross-sectional view taken along line XXIV-XXIV of FIG. 23.

FIG. 23 illustrates a top plan view of a display device according to an embodiment, FIG. 24 illustrates a cross-sectional view taken along line XXIV-XXIV of FIG. 23, and FIG. 25 to FIG. 30 illustrate sequential top plan views of a manufacturing order of a display device according to an embodiment. FIG. 23 to FIG. 30 illustrate two adjacent pixels, and the two pixels may have a shape of symmetrical to each other. Hereinafter, a pixel disposed at a left side will be mainly described.

Figure 25:
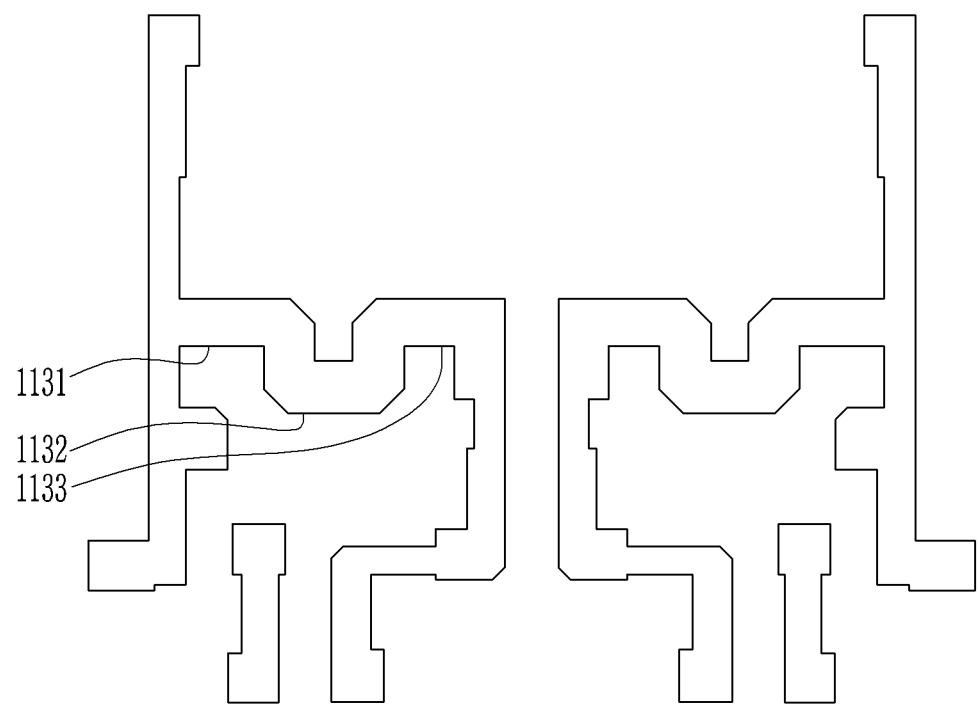
FIGS. 25, 26, 27, 28, 29, and 30 illustrate sequential top plan views of a manufacturing order of a display device according to an embodiment.

As illustrated in FIG. 23 to FIG. 30, a polycrystalline semiconductor layer including a channel 1132, a first area 1131, and a second area 1133 of the driving transistor T1 may be disposed on a substrate 110. FIG. 25 illustrates the polycrystalline semiconductor layer. The polycrystalline semiconductor layer may further include a channel, a first area, and a second area of each of the second transistor T2, the fifth transistor T5, the sixth transistor T6, the seventh transistor T7, and the eighth transistor T8 as well as the driving transistor T1.

The channel 1132 of the driving transistor T1 may have a curved shape in a plan view. However, the shape of the channel 1132 of the driving transistor T1 is not limited thereto, and may be variously changed. For example, the channel 1132 of the driving transistor T1 may be bent in a different shape, or may be formed in a rod shape. The first area 1131 and the second area 1133 of the driving transistor T1 may be disposed on respective sides of the channel 1132 of the driving transistor T1. The first area 1131 of the driving transistor T1 extends up and down in a plan view, and a portion thereof extending in the up direction may be connected to the second area of the second transistor T2, and a portion thereof extending in the down direction may be connected to the second area of the fifth transistor T5. The second area 1133 of the driving transistor T1 may downwardly extend in a plan view to be connected to the first area of the sixth transistor T6.

A barrier layer 111 may be disposed between the substrate 110 and the polycrystalline semiconductor layer including the channel 1132, the first area 1131, and the second area 1133 of the driving transistor T1.

The barrier layer 111 may include a silicon oxide ($SiO_x$), a silicon nitride ($SiN_x$), a silicon oxynitride ($SiO_xN_y$), or amorphous silicon (Si).

A first gate insulation film 141 may be disposed on the polycrystalline semiconductor layer including the channel 1132, the first area 1131, and the second area 1133 of the driving transistor T1. The first gate insulation film 141 may include a silicon oxide ($SiO_x$), a silicon nitride ($SiN_x$), or a silicon oxynitride ($SiO_xN_y$), and may have a single-layered or multi-layered structure including the same.

Figure 26:
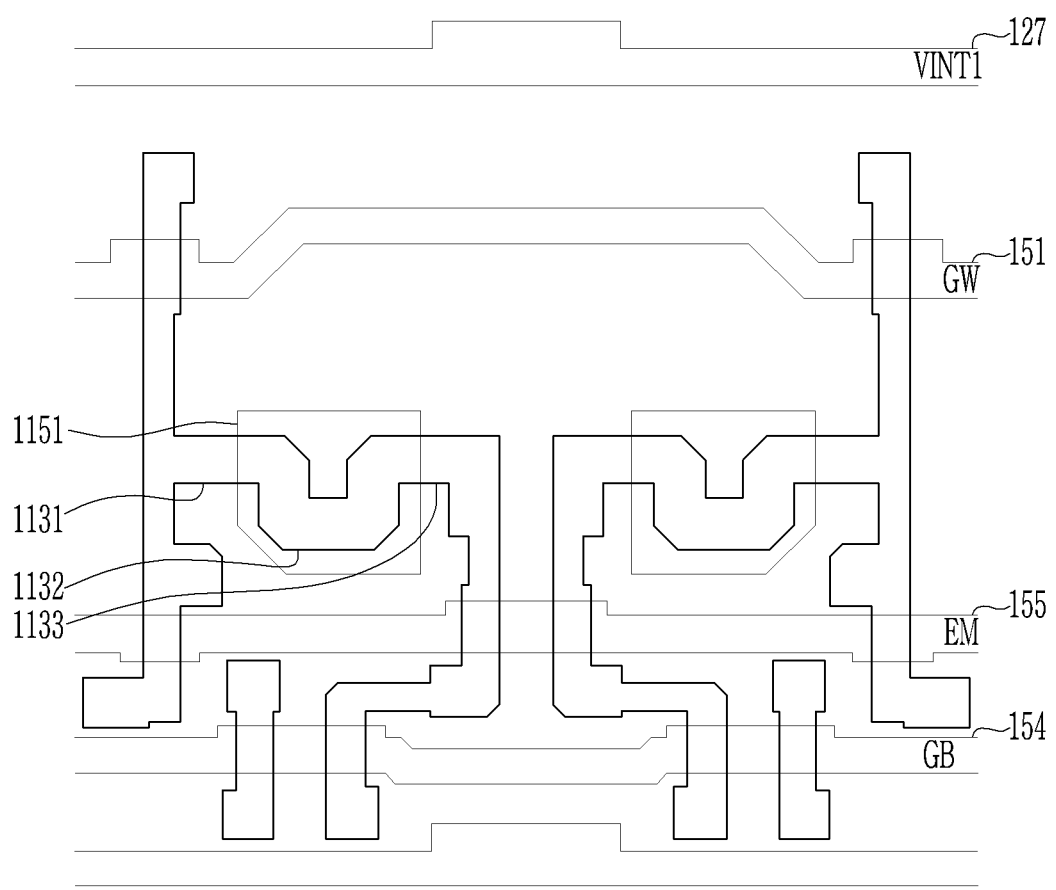

A first gate conductive layer including a gate electrode 1151 of the driving transistor T1 may be disposed on the first gate insulation film 141. FIG. 26 illustrates the polycrystalline semiconductor layer and the first gate conductive layer together. The first conductive layer may include molybdenum (Mo), aluminum (Al), copper (Cu), and/or titanium (Ti), and may have a single-layered or multi-layered structure including them.

The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include the first initialization voltage line 127, the first scan line 151, the light emission control line 155, and the bypass control line 154. The first initialization voltage line 127, the first scan line 151, the light emission control line 155, and the bypass control line 154 may substantially extend in a horizontal direction. The first initialization voltage line 127 may be connected to the first area of the fourth transistor T4. The first scan line 151 may be connected to the gate electrode of the second transistor T2. The gate electrode of the fifth transistor T5 and the gate electrode of the sixth transistor T6 may be connected to the light emission control line 155. The gate electrode of the seventh transistor T7 and the gate electrode of the eighth transistor T8 may be connected to the bypass control line 154.

As described above, the first gate layer GAT1 of the pad portion PA may be disposed on the first gate conductive layer. Accordingly, the first gate layer GAT1 may be disposed on the same layer as the gate electrode 1151 of the driving transistor T1. The first gate layer GAT1 may be disposed on the same layer as the first initialization voltage line 127, the first scan line 151, the light emission control line 155, and the bypass control line 154.

After the first gate conductive layer including the gate electrode 1151 of the driving transistor T1 is formed, a doping process may be performed. The polycrystalline semiconductor layer covered by the first gate conductive layer is not doped, and a portion of the polycrystalline semiconductor layer that is not covered by the first gate conductive layer may be doped to have the same characteristic as a conductor. In this case, a doping process may be performed with a p-type dopant, and the driving transistor T1, the second transistor T2, the fifth transistor T5, the sixth transistor T6, the seventh transistor T7, and the eighth transistor T8 that include the polycrystalline semiconductor may have characteristics of a p-type transistor.

A second gate insulation film 142 may be disposed on the first gate conductive layer and the first gate insulation film 141 including the gate electrode 1151 of the driving transistor T1. The second gate insulation film 142 may include a silicon oxide (SiOx), a silicon nitride (SiNx), or a silicon oxynitride (SiOxNy), and may have a single-layered or multi-layered structure including them.

Figure 27:
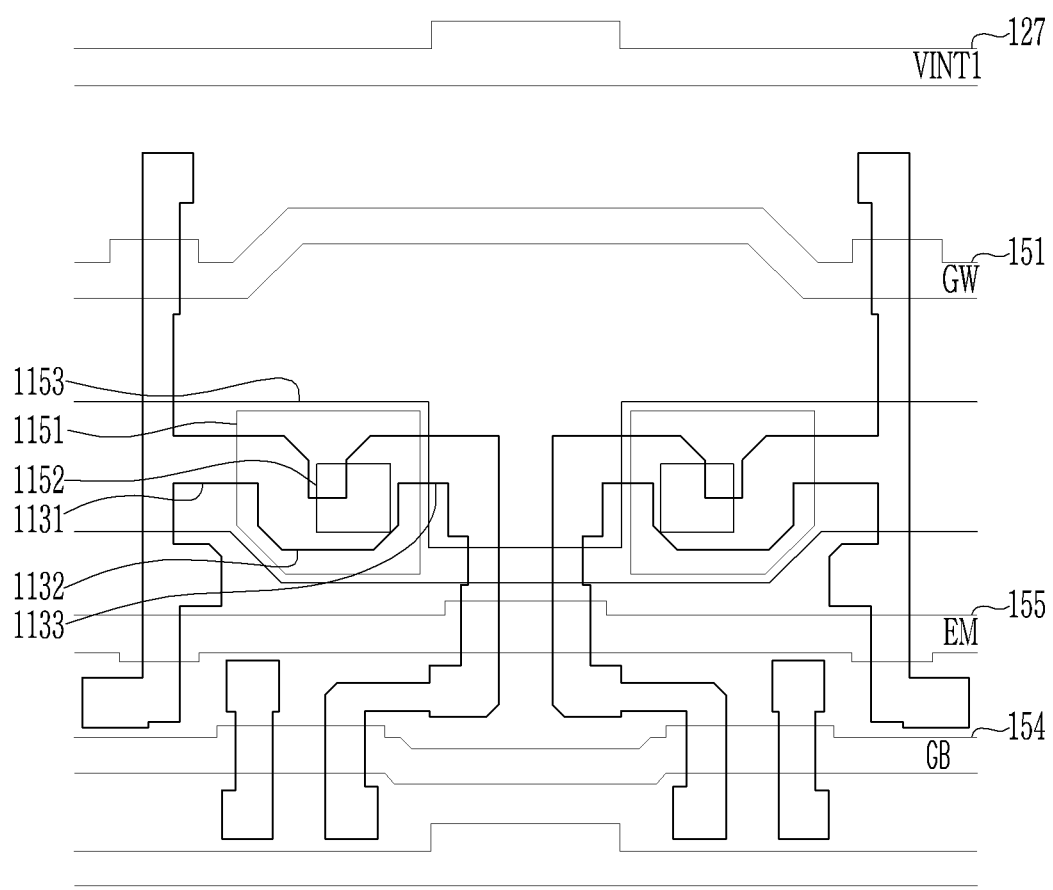

A second gate conductive layer including the first storage electrode 1153 of the storage capacitor Cst may be positioned on the second gate insulation film 142. FIG. 27 illustrates the polycrystalline semiconductor layer, the first gate conductive layer, and the second gate conductive layer together. The second conductive layer may include molybdenum (Mo), aluminum (Al), copper (Cu), silver (Ag), chromium (Cr), tantalum (Ta), and titanium (Ti), and may have a single-layered or multi-layered structure including them.

The first storage electrode 1153 overlaps the gate electrode 1151 of the driving transistor T1 to form the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1.

As described above, the second gate layer GAT2 of the pad portion PA may be disposed on the second gate conductive layer. Accordingly, when the pad portion PA includes the second gate layer GAT2 instead of the first gate layer GAT1, the second gate layer GAT2 may be disposed on the same layer as the first storage electrode 1153 of the storage capacitor Cst.

The first interlayer insulation film 161 may be disposed on the second gate conductive layer including the first storage electrode 1153 of the storage capacitor Cst. The first interlayer insulation film 161 may include a silicon oxide (SiOx), a silicon nitride (SiNx), or a silicon oxynitride (SiOxNy), and may have a single-layered or multi-layered structure including them.

Figure 28:
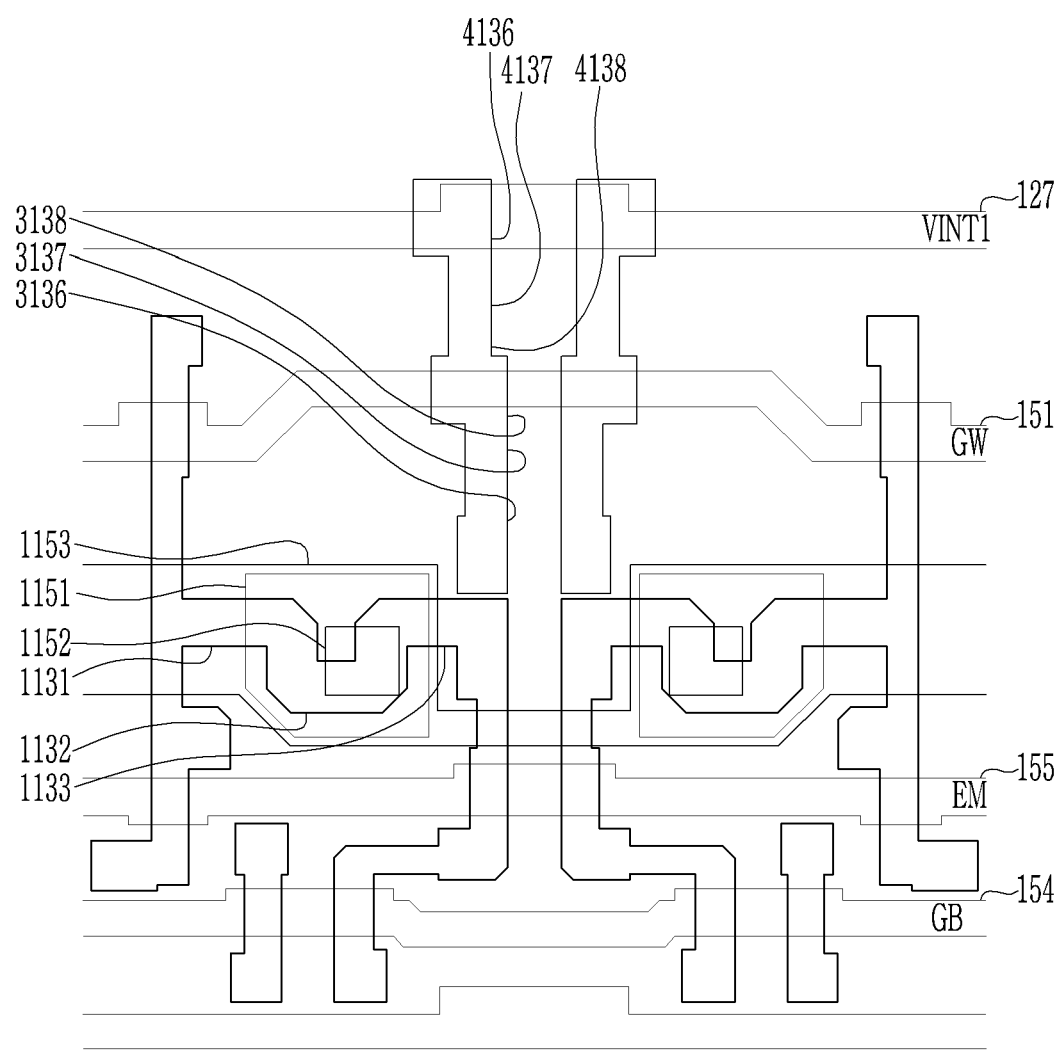

The oxide semiconductor layer including the channel 3137, the first area 3136, and the second area 3138 of the third transistor T3, and the channel 4137, the first area 4136, and the second area 4138 of the fourth transistor T4 may be disposed on the first interlayer insulation film 161. FIG. 28 illustrates a polycrystalline semiconductor layer, a first gate conductive layer, a second gate conductive layer, and an oxide semiconductor layer together. The oxide semiconductor layer may include an indium-gallium-zinc oxide (IGZO) among In—Ga—Zn based oxides.

A channel 3137, a first area 3136, and a second area 3138 of the third transistor T3, and a channel 4137, a first area 4136, and a second area 4138 of the fourth transistor T4 may be connected to each other to be integrally formed. The first area 3136 and the second area 3138 of the third transistor T3 may be disposed at respective sides of the channel 3137 of the third transistor T3. The first area 4136 and the second area 4138 of the fourth transistor T4 may be disposed at respective sides of the channel 4137 of the fourth transistor T4. The second area 3138 of the third transistor T3 may be connected the second area 4138 of the fourth transistor T4.

A third gate insulation film 143 may be disposed on the oxide semiconductor layer including the channel 3137, the first area 3136, and the second area 3138 of the third transistor T3, and the channel 4137, the first area 4136, and the second area 4138 of the fourth transistor T4. The third gate insulation film 143 may include a silicon oxide (SiOx), a silicon nitride (SiNx), or a silicon oxynitride (SiOxNy), and may have a single-layered or multi-layered structure including them.

The third gate insulation film 143 may be disposed on an entire surface of the oxide semiconductor layer and the first interlayer insulation film 161. The third gate insulation film 143 may cover upper and lateral surfaces of the channel 3137, the first area 3136, and the second area 3138 of the third transistor T3, and of the channel 4137, the first area 4136, and the second area 4138 of the fourth transistor T4. However, the present embodiment is not limited thereto, and the third gate insulation film 143 may not be disposed on the entire surface of the oxide semiconductor layer and the first interlayer insulation film 161. For example, the third gate insulation film 143 may overlap the channel 3137 of the third transistor T3, and it may not overlap the first area 3136 and the second area 3138 thereof. In addition, the third gate insulation film 143 may overlap the channel 4137 of the fourth transistor T4, and it may not overlap the first area 4136 and the second area 4138 thereof.

Figure 29:
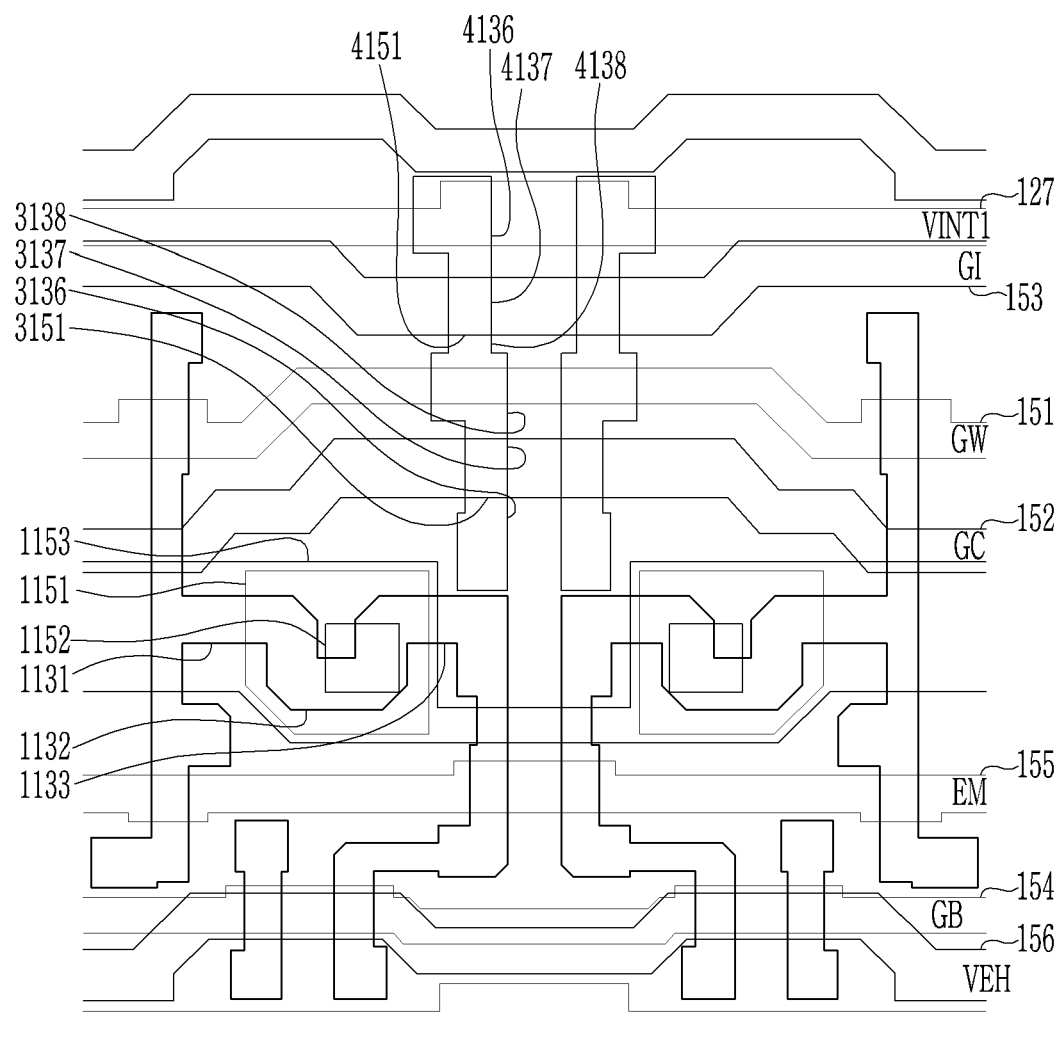

A third gate conductive layer including the gate electrode 3151 of the third transistor T3 and the gate electrode 4151 of the fourth transistor T4 can be positioned on the third gate insulation film 143. FIG. 29 illustrates the polycrystalline semiconductor layer, the first gate conductive layer, the second gate conductive layer, the oxide semiconductor layer, and the third gate conductive layer together. The third conductive layer may include molybdenum (Mo), aluminum (Al), copper (Cu), and/or titanium (Ti), and may have a single-layered or multi-layered structure including them. For example, the third gate conductive layer may include a lower layer including titanium and an upper layer including molybdenum.

The gate electrode 3151 of the third transistor T3 may overlap the channel 3137 of the third transistor T3. The gate electrode 4151 of the fourth transistor T4 may overlap the channel 4137 of the fourth transistor T4.

The third gate conductive layer may further include the initialization control line 153, the second scan line 152, and the reference voltage line 156. The initialization control line 153, the second scan line 152, and the reference voltage line 156 may substantially extend in a horizontal direction. The initialization control line 153 may be connected to the gate electrode 4151 of the fourth transistor T4. The second scan line 152 may be connected to the gate electrode 3151 of the third transistor T3. The reference voltage line 156 may be connected to the first area of the eighth transistor T8.

As described above, the third gate layer GAT3 of the pad portion PA may be disposed on the third gate conductive layer. Accordingly, the third gate layer GAT3 may be disposed on the same layer as the gate electrode 3151 of the third transistor T3 and the gate electrode 4151 of the fourth transistor T4. The third gate layer GAT3 may be disposed on the same layer as the initialization control line 153, the second scan line 152, and the reference voltage line 156.

After the third gate conductive layer including the gate electrode 3151 of the third transistor T3 and the gate electrode 4151 of the fourth transistor T4 are formed, a doping process may be performed. A portion of the oxide semiconductor layer that is covered by the third gate conductive layer is not doped, and a portion of the oxide semiconductor layer that is not covered by the third gate conductive layer is doped, so that it may have the same characteristics as the conductor. The channel 3137 of the third transistor T3 may be disposed under the gate electrode 3151 to overlap the gate electrode 3151. The first area 3136 and the second area 3138 of the third transistor T3 may not overlap the gate electrode 3151. The channel 4137 of the fourth transistor T4 may be disposed under the gate electrode 4151 to overlap the gate electrode 4151. The first area 4136 and the second area 4138 of the fourth transistor T4 may not overlap the gate electrode 4151. The doping process of the oxide semiconductor layer may be performed with an n-type dopant, and the third transistor T3 and the fourth transistor T4 including the oxide semiconductor layer may have an n-type transistor characteristic.

The second interlayer insulation film 162 may be disposed on the third gate conductive layer including the gate electrode 3151 of the third transistor T3 and the gate electrode 4151 of the fourth transistor T4. The second interlayer insulation film 162 may include a silicon oxide ($SiO_x$), a silicon nitride ($SiN_x$), or a silicon oxynitride ($SiO_xN_y$), and may a single-layered or multi-layered structure including them. A first opening 1165, a second opening 1166, a third opening 3165, a fourth opening 3166, a fifth opening 4165, and a sixth opening 4166 may be formed on the second interlayer insulation film 162.

The first opening 1165 may overlap at least portion of the gate electrode 1151 of the driving transistor T1. The first opening 1165 may be further formed in the third gate insulation film 143, the first interlayer insulation film 161, and the second gate insulation film 142. The first opening 1165 may overlap the opening 1152 of the first storage electrode 1153. The first opening 1165 may be disposed inside the opening 1152 of the first storage electrode 1153. The second opening 1166 may overlap at least a portion of the second area 3138 of the third transistor T3. The second opening 1166 may be further formed in the third gate insulation film 143.

The third opening 3165 may overlap at least a portion of the second area 1133 of the driving transistor T1. The third opening 3165 may be further formed in the third gate insulation film 143, the first interlayer insulation film 161, the second gate insulation film 142, and the first gate insulation film 141. The fourth opening 3166 may overlap at least a portion of the first area 3136 of the third transistor T3. The fourth opening 3166 may be further formed in the third gate insulation film 143.

The fifth opening 4165 may overlap at least a portion of the first area 4136 of the fourth transistor T4. The fifth opening 4165 may be further formed in the third gate insulation film 143. The sixth opening 4166 may overlap at least portion of the first initialization voltage line 127. The sixth opening 4166 may be further formed in the third gate insulation film 143, the first interlayer insulation film 161, and the second gate insulation film 142.

Figure 30:
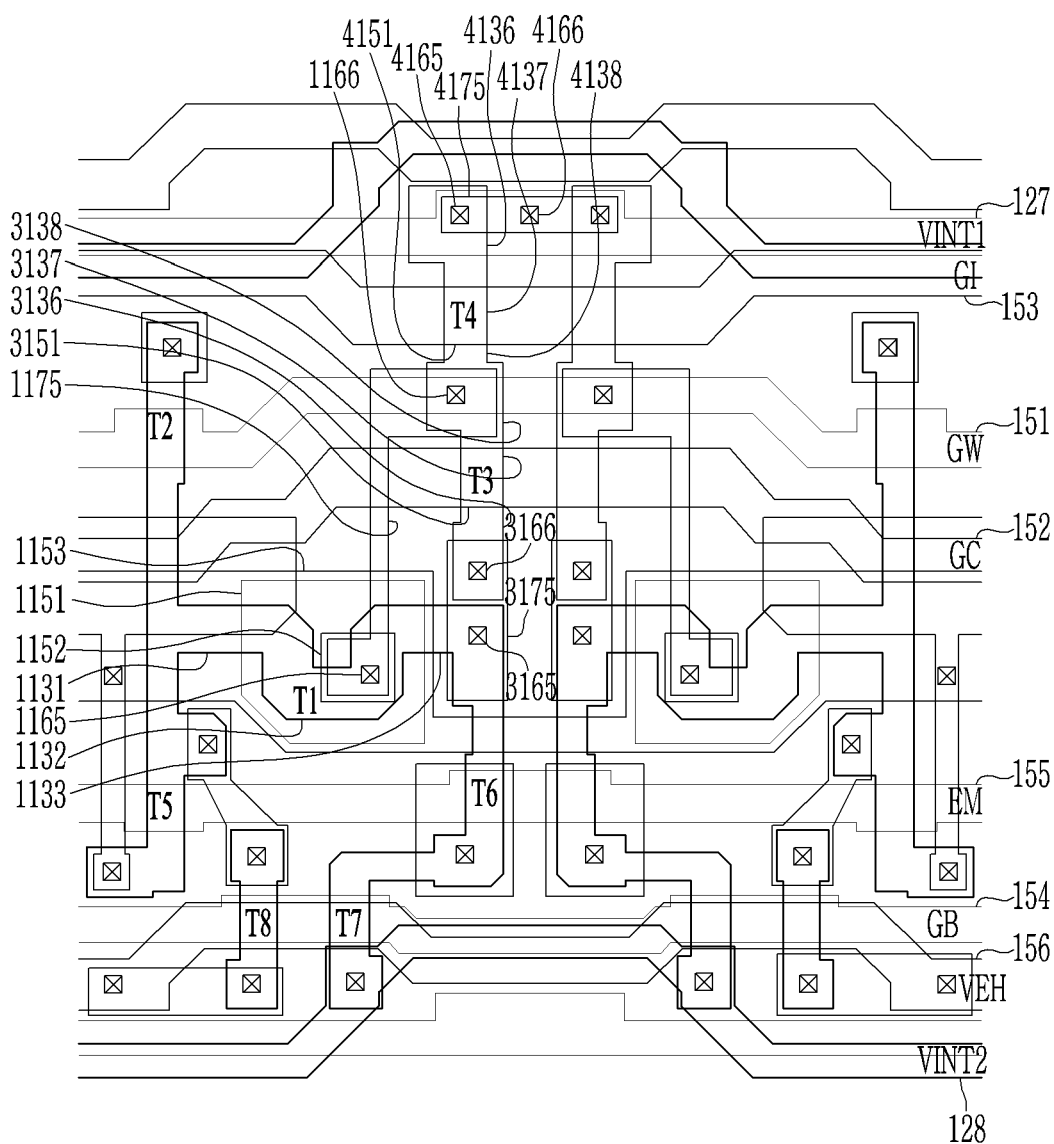

A first data conductive layer including a first connection electrode 1175, a second connection electrode 3175, and a third connection electrode 4175 may be disposed on the second interlayer insulation film 162. FIG. 30 illustrates the polycrystalline semiconductor layer, the first gate conductive layer, the second gate conductive layer, the oxide semiconductor layer, the third gate conductive layer, and the first data conductive layer together. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may have a single-layered or multi-layered structure including them. For example, the first data conductive layer may have a triple-layered structure of a lower film containing a refractory metal such as molybdenum, chromium, tantalum, and titanium, or an alloy thereof; an interlayer film containing an aluminum-based metal, a silver-based metal, and a copper-based metal that have low resistivity; and an upper film containing a refractory metals such as molybdenum, chromium, tantalum, and titanium.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the second area 3138 of the third transistor T3. The first connection electrode 1175 may be connected to the second area 3138 of the third transistor T3. Accordingly, the gate electrode 1151 of the driving transistor T1 and the second area 3138 of the third transistor T3 may be connected by the first connection electrode 1175.

The second connection electrode 3175 may overlap the second area 1133 of the driving transistor T1. The second connection electrode 3175 may be connected to the second area 1133 of the driving transistor T1 through the third opening 3165. The second connection electrode 3175 may overlap the first area 3136 of the third transistor T3. The second connection electrode 3175 may be connected to the first area 3136 of the third transistor T3 through the fourth opening 3166. Accordingly, the second area 1133 of the driving transistor T1 and the first area 3136 of the third transistor T3 may be connected by the second connection electrode 3175.

The third connection electrode 4175 may overlap the first area 4136 of the fourth transistor T4. The third connection electrode 4175 may be connected to the first area 4136 of the fourth transistor T4 through the fifth opening 4165. The third connection electrode 4175 may overlap the first initialization voltage line 127. The third connection electrode 4175 may be connected to the first initialization voltage line 127 through the sixth opening 4166. Accordingly, the first area 4136 of the fourth transistor T4 and the first initialization voltage line 127 may be connected by the third connection electrode 4175.

The first data conductive layer may further include the second initialization voltage line 128. The second initialization voltage line 128 may substantially extend in a horizontal direction. The second initialization voltage line 128 may be connected to the second area of the seventh transistor T7.

As described above, the first data layer DAT1 of the pad portion PA may be disposed on the first data conductive layer. Accordingly, the first data layer DAT1 may be disposed on the same layer as the first connection electrode 1175, the second connection electrode 3175, and the third connection electrode 4175. The first data layer DAT1 may be disposed on the same layer as the second initialization voltage line 128.

A third interlayer insulation film 180 may be disposed on the first data conductive layer including the first connection electrode 1175, the second connection electrode 3175 and the third connection electrode 4175. The third interlayer insulation film 180 may include an organic insulating material such as a general purpose polymer such as polymethylmethacrylate (PMMA) or polystyrene (PS), a polymer derivative having a phenolic group, an acryl-based polymer, an imide-based polymer, a polyimide, and a siloxane-based polymer.

A second data conductive layer including the data line 171 and the driving voltage line 172 may be disposed on the third interlayer insulation film 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may have a single-layered or multi-layered structure including them.

The data line 171 and the driving voltage line 172 may substantially extend in a vertical direction. The data line 171 may be connected to the second transistor T2. The data line 171 may be connected to the first area of the second transistor T2. The driving voltage line 172 may be connected to the fifth transistor T5. The driving voltage line 172 may be connected to the first area of the fifth transistor T5. The driving voltage line 172 may be connected to the storage capacitor Cst. The driving voltage line 172 may be connected to the first storage electrode 1153 of the storage capacitor Cst. The first storage electrodes 1153 of the storage capacitors Cst of adjacent pixels may be connected to each other and may substantially extend in a horizontal direction.

As described above, the second data layer DAT2 of the pad portion PA may be disposed on the second data conductive layer. Accordingly, the second data layer DAT2 may be disposed on the same layer as the data line 171 and the driving voltage line 172.

Although not illustrated, a passivation film may be disposed on the second data conductive layer including the data line 171 and the driving voltage line 172, and an anode electrode may be disposed on the passivation film. The anode electrode may be connected to the sixth transistor T6 to receive an output current of the driving transistor T1. A partition wall may be disposed on the anode electrode. An opening is formed in the partition wall, and the opening of the partition wall may overlap the anode electrode. A light emitting element layer may be disposed in the opening of the partition wall. A cathode electrode may be disposed on the light emitting element layer and the partition wall. The anode electrode, the light emitting element layer, and the cathode electrode may form the light emitting diode (LED).

As described above, in the display area of the display device according to the embodiment, the driving transistor T1 may include a polycrystalline semiconductor, and the third transistor T3 and the fourth transistor T4 may include an oxide semiconductor. As described above, by making the third transistor T3 and the fourth transistor T4 contain a semiconductor material different from the driving transistor T1, they may be more stably driven, and their reliability may be improved.

In the above, the transistor included in one pixel and the planar and cross-sectional position of the wire connected thereto have been described, but the present invention is not limited thereto. The position of each constituent element in a plan view and a cross-sectional view may be variously changed.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a display area and a non-display area; and
a first gate conductive layer;
a first insulation film disposed on the first gate conductive layer;
a second insulation film that is disposed on the first gate conductive layer;
a second gate conductive layer; and
a first data conductive layer,
wherein
a length of the first gate conductive layer in a first direction parallel to a surface of the substrate is longer than a length of the second gate conductive layer in the first direction parallel to the surface of the substrate, and
wherein a top surface of the second insulation film is in contact with the second gate conductive layer and a bottom surface of the second insulation film is in contact with the first insulation film,
wherein
the first data conductive layer is in direct contact with the second gate conductive layer in an area in which the first gate conductive layer and the second gate conductive layer overlap in a direction perpendicular to the surface of the substrate, and
the first data conductive layer is in direct contact with the first gate conductive layer in an area in which the first gate conductive layer and the second gate conductive layer do not overlap in the direction perpendicular to the surface of the substrate.

2. The display device of claim 1, wherein an area of a region in which the first gate conductive layer and the second gate conductive layer overlap in the direction perpendicular to the surface of the substrate is 30% or more among an entire area of an opening of the second insulation film.

3. The display device of claim 1, wherein an area sum of regions in which the first gate conductive layer and the second gate conductive layer do not overlap in the direction perpendicular to the surface of the substrate among an opening of the second insulation film is 1.5 $\mu m^2$ or more.

4. The display device of claim 1, wherein
at least one sub-opening of the second gate conductive layer that overlaps the first gate conductive layer is disposed within the opening of the second insulation film, and
a shape of the at least one sub-openings of the second gate conductive layer is one of a linear shape, a circular shape, and a polygonal shape.

5. The display device of claim 4, wherein a shortest width of the at least one sub-opening of the second gate conductive layer is 2 $\mu m$ or less.

6. The display device of claim 1, wherein the pad portion further includes a second data layer disposed on the first data conductive layer.

* * * * *